United States Patent
Bhalla et al.

(10) Patent No.: US 8,860,098 B2
(45) Date of Patent: Oct. 14, 2014

(54) VJFET DEVICES

(71) Applicant: United Silicon Carbide, Inc., Monmouth Junction, NJ (US)

(72) Inventors: Anup Bhalla, Mounmouth Junction, NJ (US); Peter Alexandrov, Monmouth Junction, NJ (US)

(73) Assignee: United Silicon Carbide, Inc., Monmouth Junction, NJ (US)

( * ) Notice: Subject to any disclaimer, the term of this patent is extended or adjusted under 35 U.S.C. 154(b) by 0 days.

(21) Appl. No.: 14/212,299

(22) Filed: Mar. 14, 2014

(65) Prior Publication Data

US 2014/0264477 A1     Sep. 18, 2014

Related U.S. Application Data

(60) Provisional application No. 61/792,141, filed on Mar. 15, 2013.

(51) Int. Cl.
| | | |
|---|---|---|
| *H01L 29/80* | (2006.01) | |
| *H01L 31/062* | (2012.01) | |
| *H01L 21/337* | (2006.01) | |
| *H01L 21/336* | (2006.01) | |
| *H01L 29/808* | (2006.01) | |
| *H01L 29/66* | (2006.01) | |
| *H01L 29/16* | (2006.01) | |

(52) U.S. Cl.
CPC ...... *H01L 29/8083* (2013.01); *H01L 29/66909* (2013.01); *H01L 29/1608* (2013.01)
USPC ........... 257/263; 257/272; 257/341; 438/186; 438/192; 438/268

(58) Field of Classification Search
USPC .......... 257/256, 263, 272, 341; 438/186, 188, 438/191–193, 268, 282, 526
See application file for complete search history.

(56) References Cited

U.S. PATENT DOCUMENTS

| | | |
|---|---|---|
| 7,420,245 B2 | 9/2008 | Yamashita et al. |
| 7,750,377 B2 | 7/2010 | Hoshino et al. |
| 2009/0166722 A1 | 7/2009 | Hebert |
| 2011/0127606 A1* | 6/2011 | Bobde et al. .................. 257/337 |

* cited by examiner

*Primary Examiner* — Hsien Ming Lee
(74) *Attorney, Agent, or Firm* — Baker & Hostetler LLP

(57) ABSTRACT

The present disclosure describes structures and processes to produce high voltage JFETs in wide-bandgap materials, most particularly in Silicon Carbide. The present disclosure also provides for products produced by the methods of the present disclosure and for apparatuses used to perform the methods of the present disclosure.

20 Claims, 17 Drawing Sheets

Trench fill and planarization. Top overlay metal deposition and masked etch.

FIG. 1A Starting Wafer
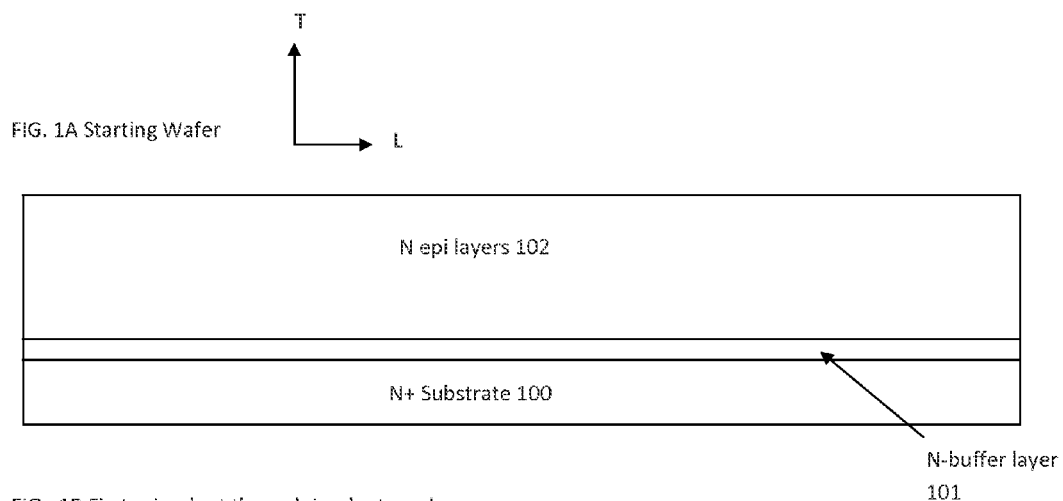
FIG. 1B First p-implant through implant mask
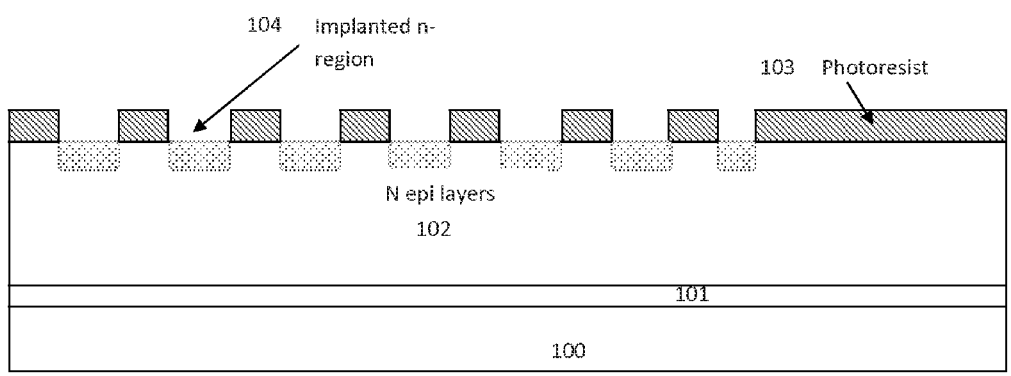

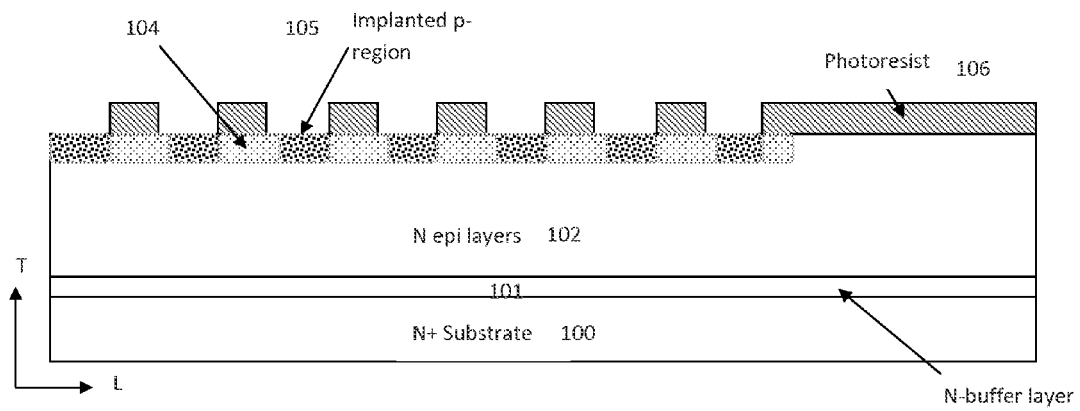
FIG 1C: First n-implant through implant mask
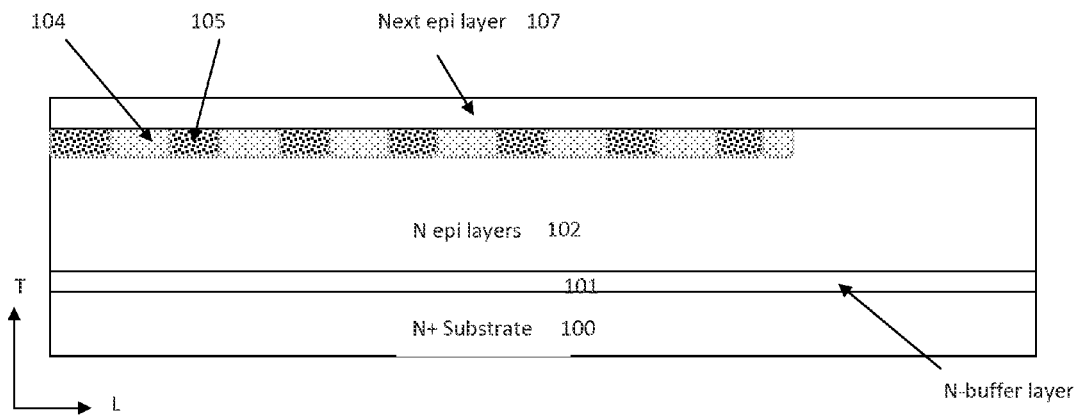
Fig 1D. Grow epi layer

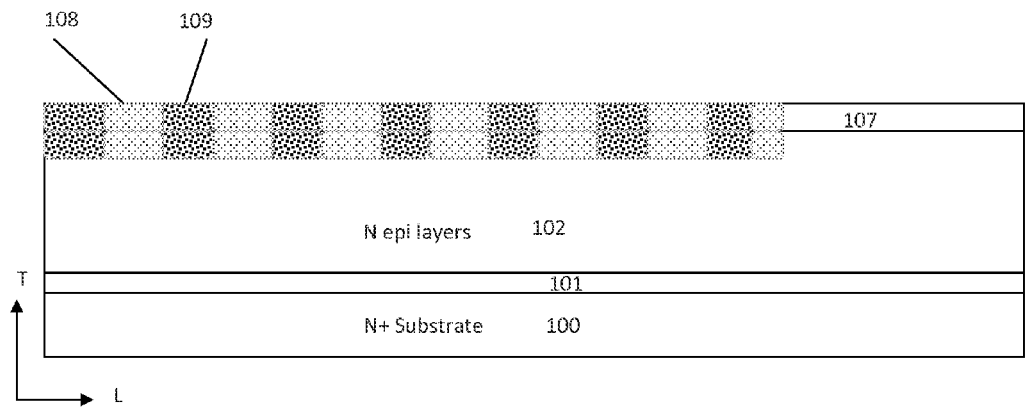
Figure 1E. Next pair of n and p implants
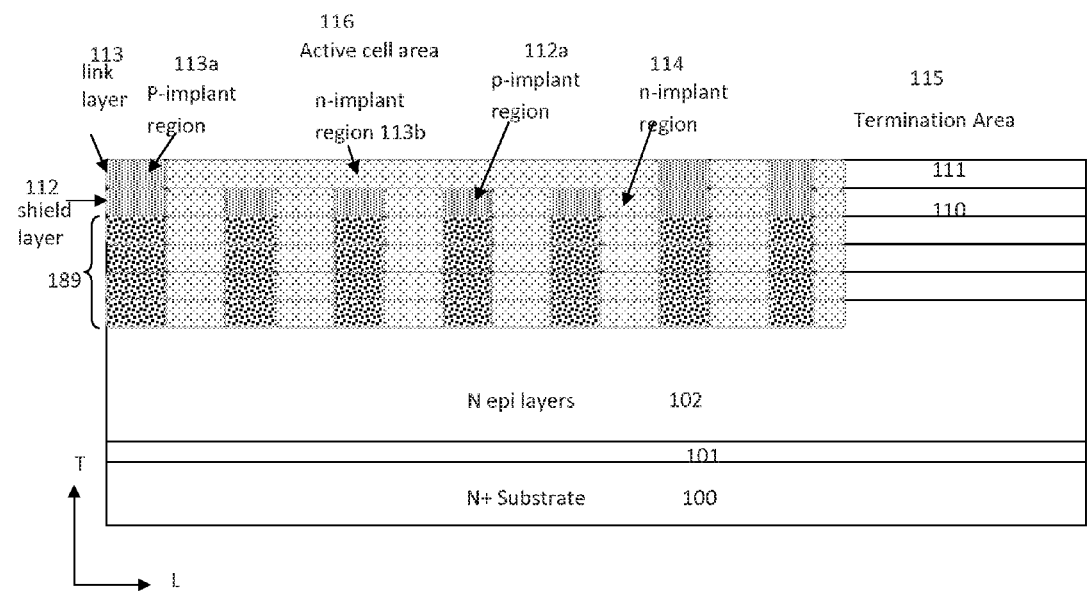
Figure 1F. After superjunction layers, grow and implant the shield layer, then the link layers that connect the shield p-regions to the source

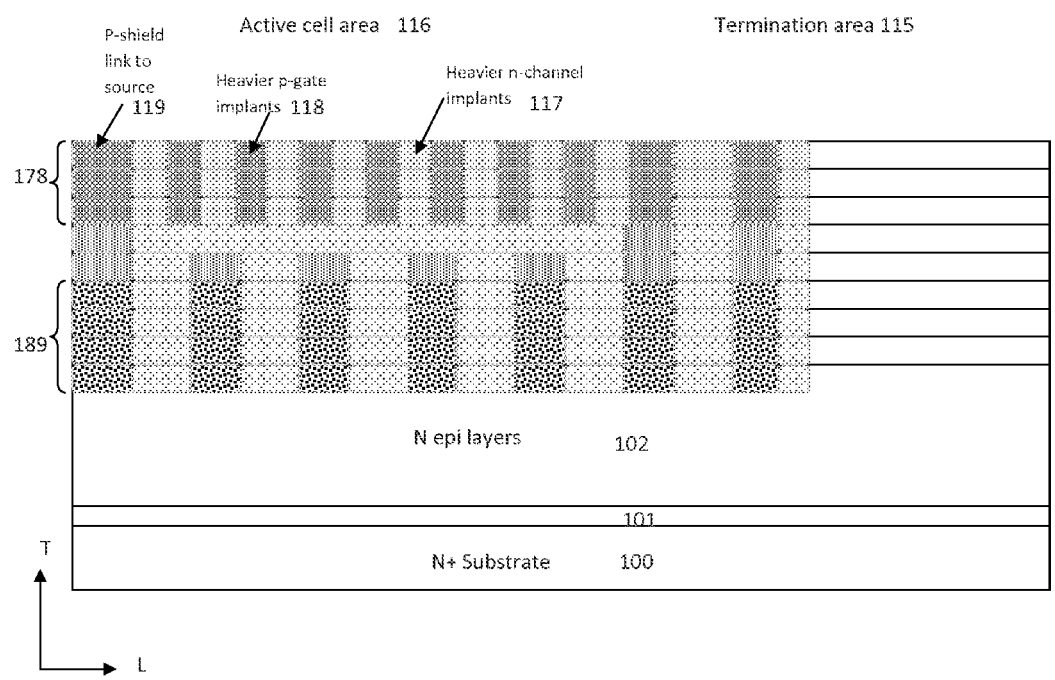
Figure 1G. Grow and implant sequence for the JFET gate and channel regions.

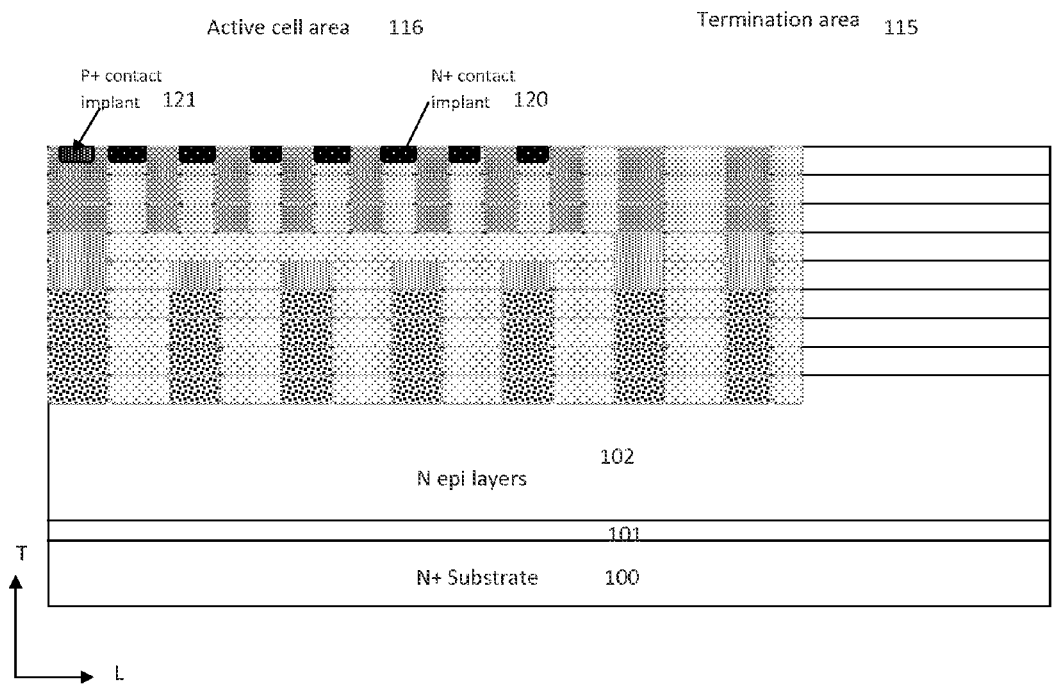
Figure 1H. Surface implants for contact formation. Masked n+ implant followed by masked p+ implant. P+ implant to gate contact area not shown – it may be offset from the n+ contacts in the z-direction.

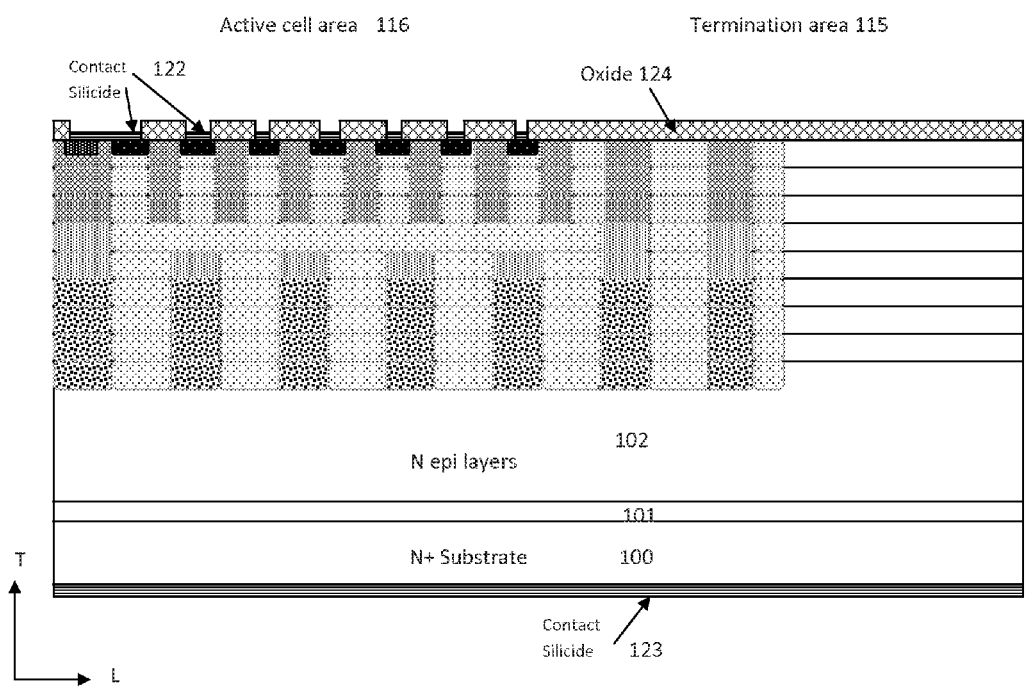
Figure 1I. Oxide deposition patterning for silicidation of p-gate, pi-link and n-source regions. Backside metal deposition and contact formation.

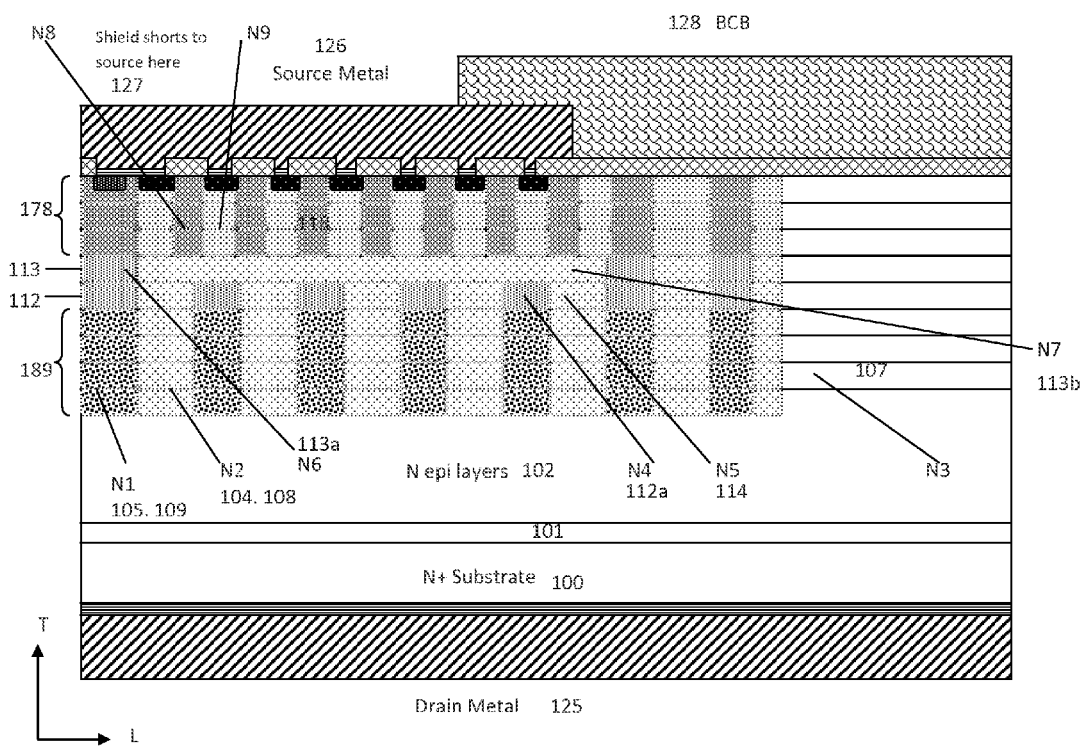
Figure 1J. Overlay metal front and pattern. Front BCB or Polyimide pattern. Backside overlay metal.

Figure 2A. Starting Wafer
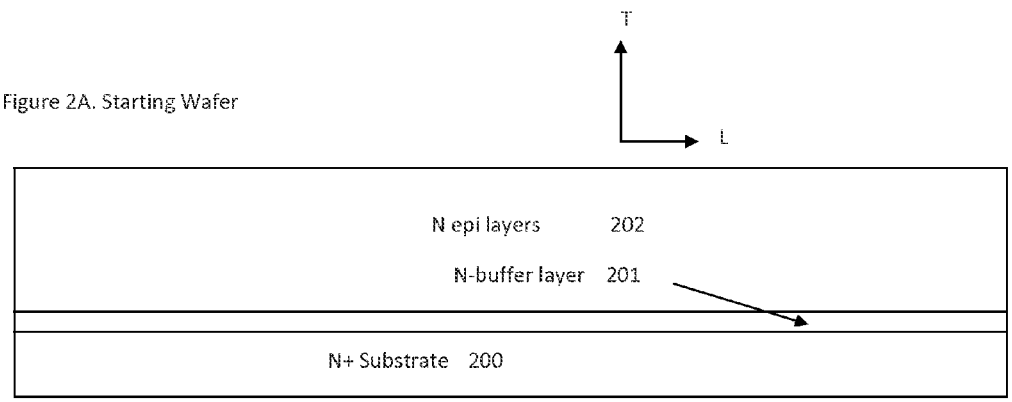
Figure 2B. First p-implant through a mask
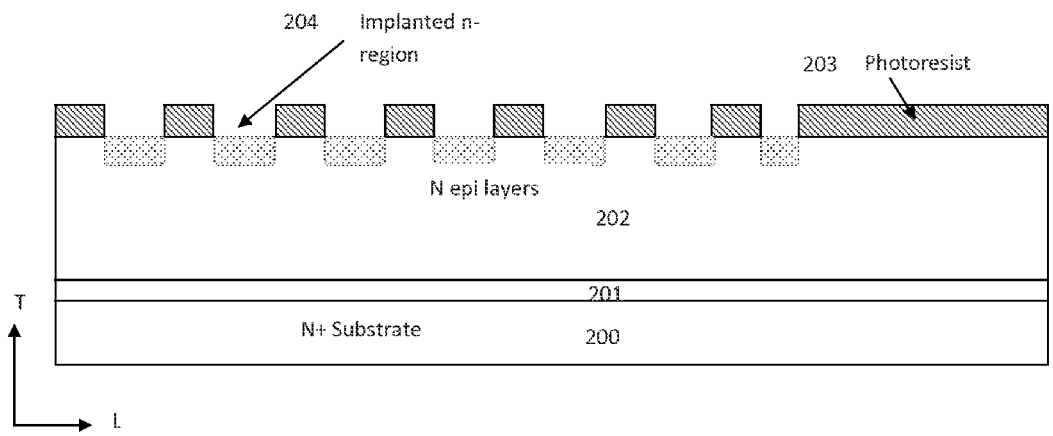

Figure 2C. First n-implant through implant mask
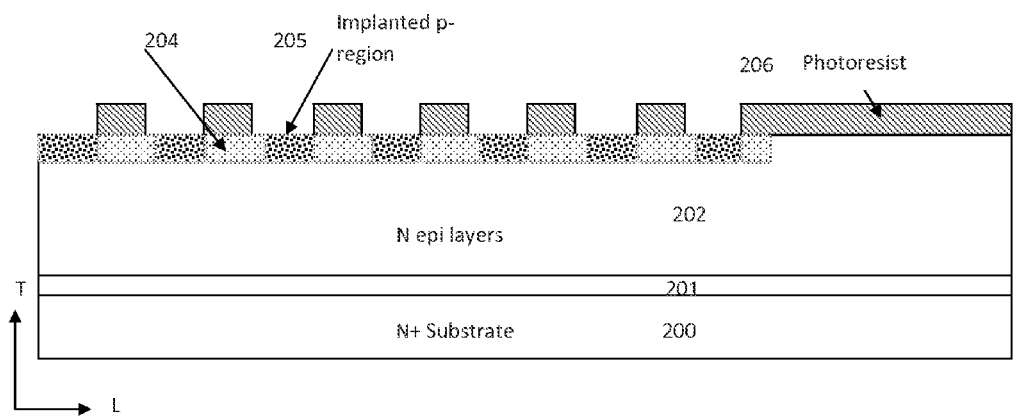
Figure 2D. Grow epi layer
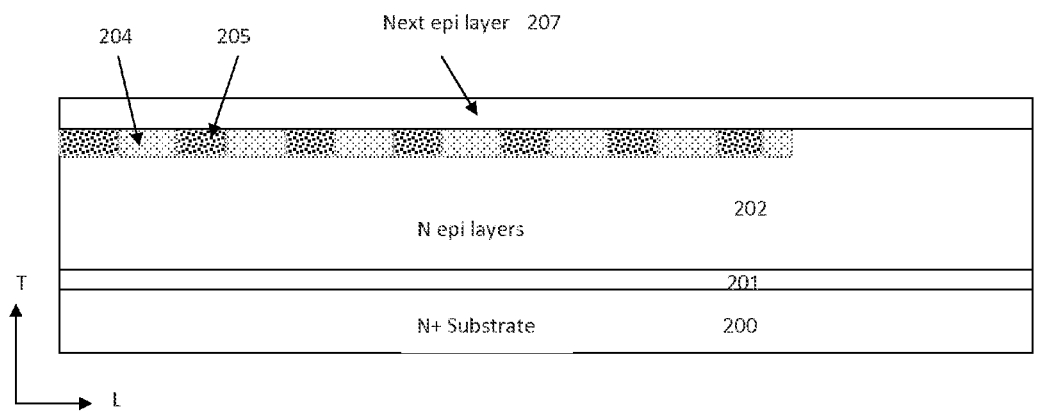

Figure 2E. Next pair of masked n and p implants
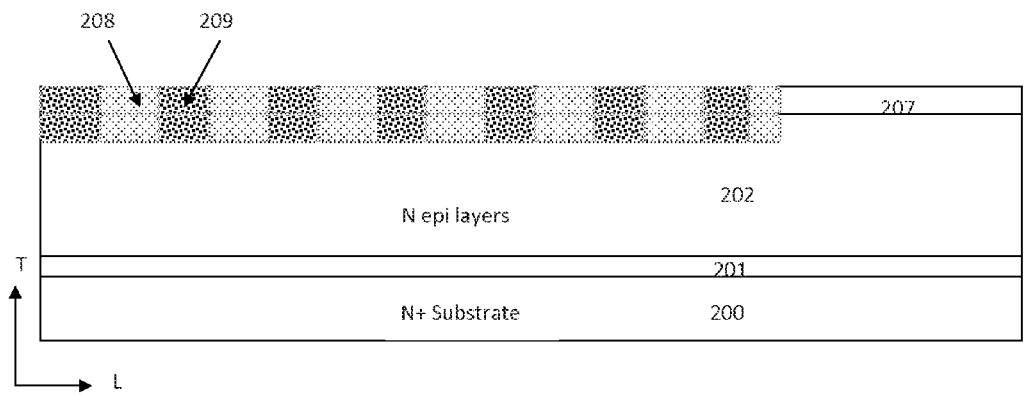
Figure 2F: After superjunction layers, grow and implant the shield layer, then grow the epi region for the channel regions to be formed.
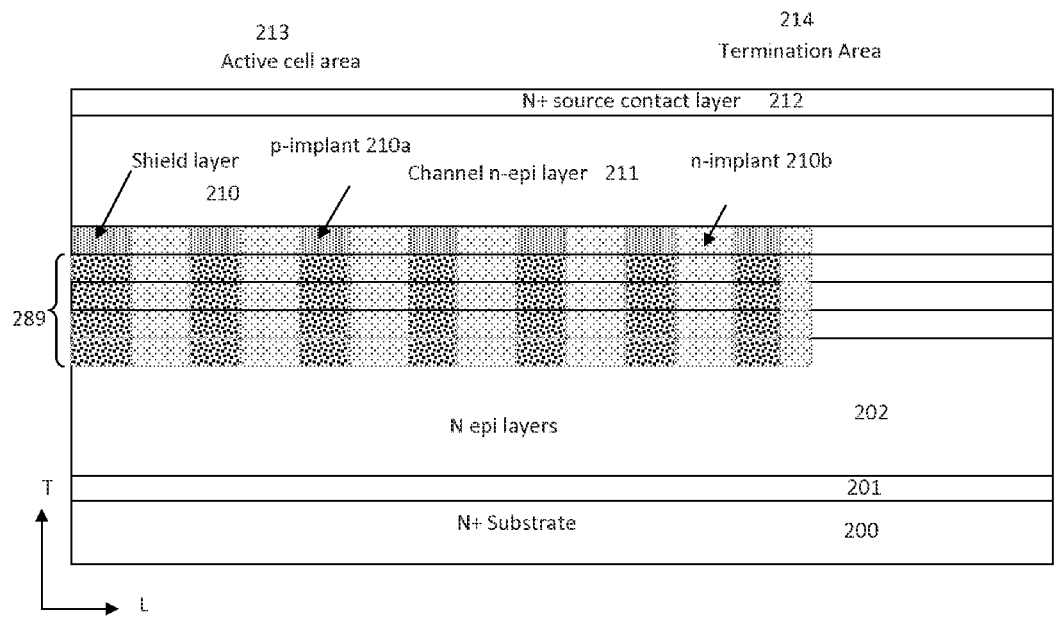

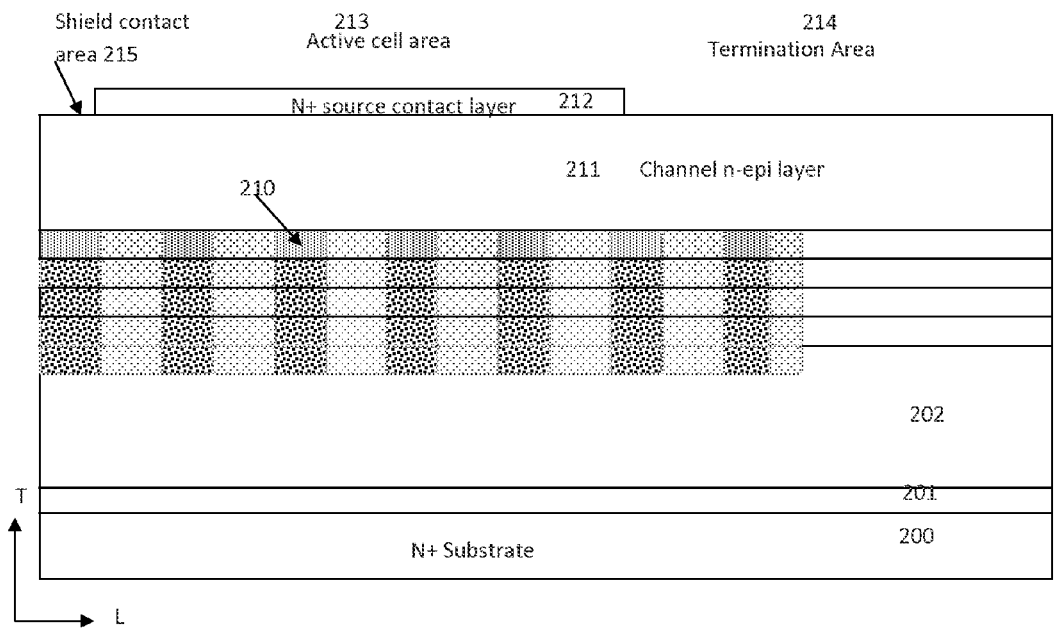
Figure 2G. N+ removal from termination area by Mask and etch. N+ is also removed in the area where the shield contact trench will be formed.

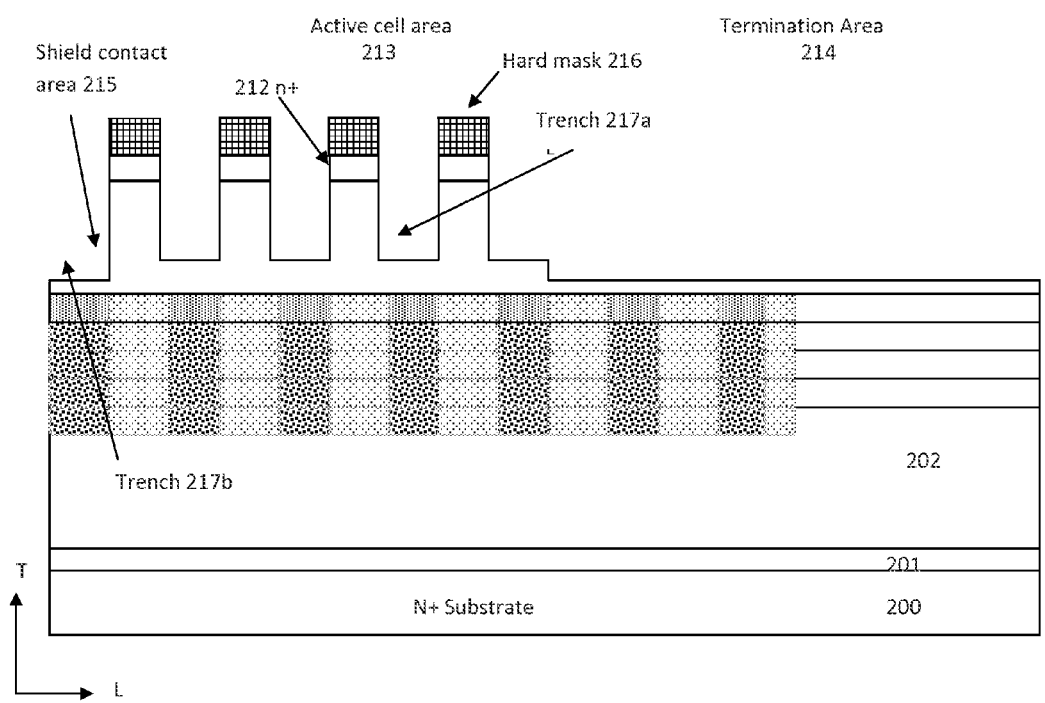
Figure 2H. Hardmask deposition(e.g. Ni on oxide) and Trench etch. Trench etched deeper in areas where N+ was originally etched away. This allows easier implant based access to the shield layer.

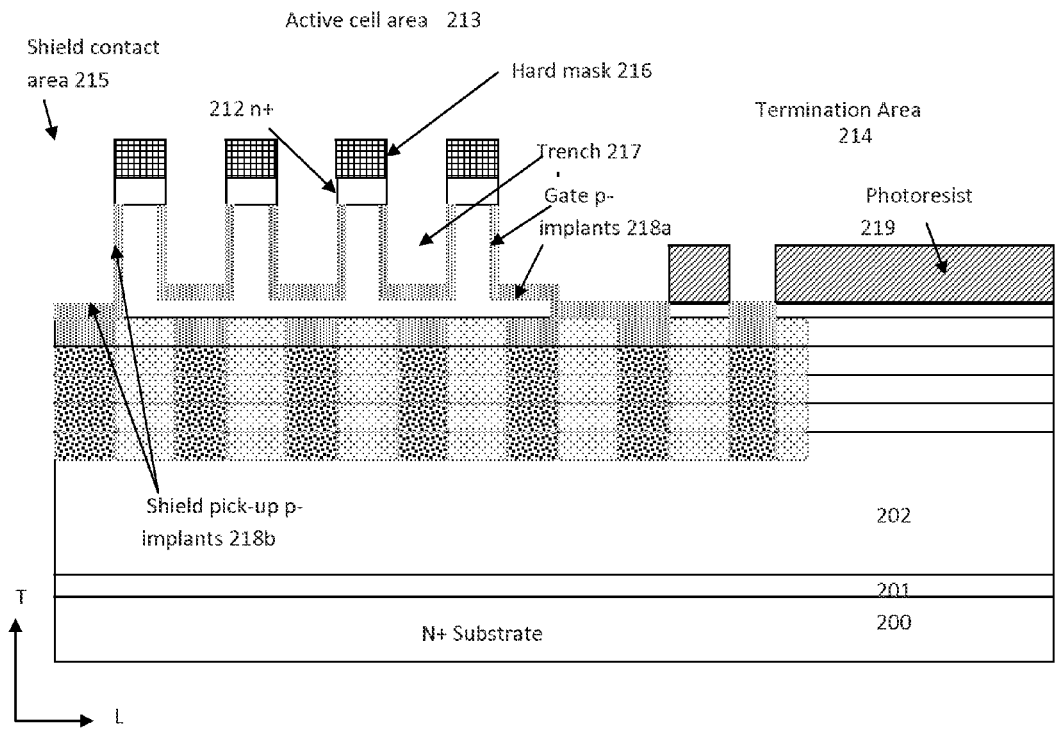
Figure 2I. Vertical and angled p+ implants, masked over the termination area to form guard rings.
The deeper shield pickup trench allows the implant to connect to the buried shield, while maintaining sufficient space between shield and the bottom of the gate trenches.

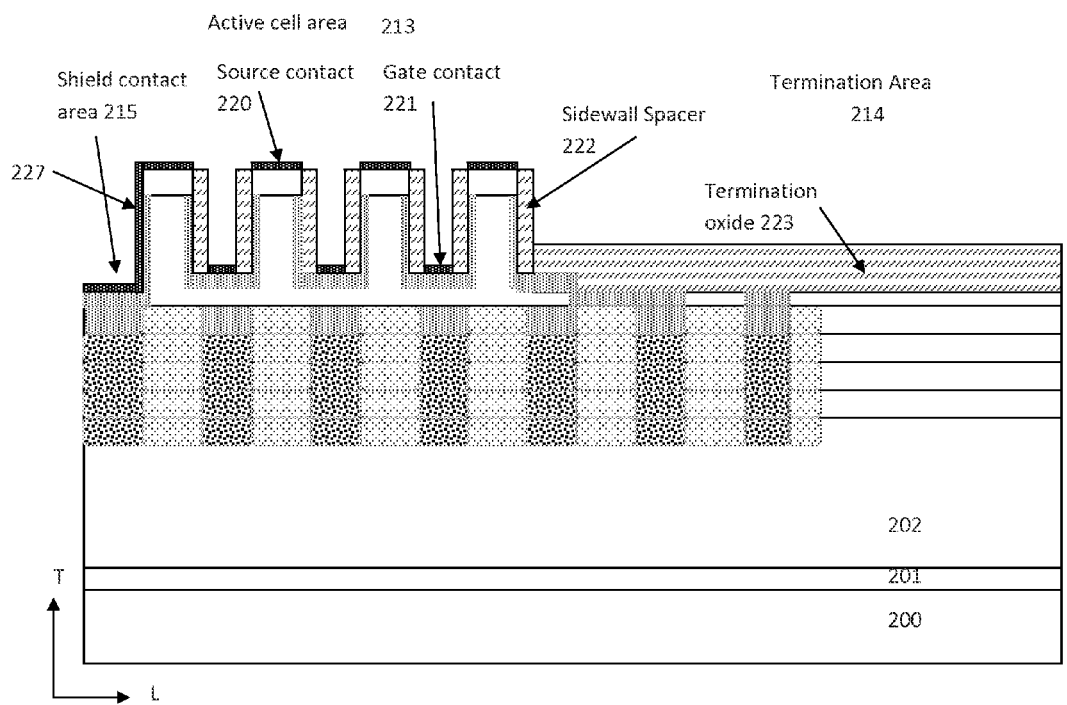
Figure 2J. Oxide spacer formation. Masked oxide tech back preserves oxide over the termination. Second mask applied to strip spacer oxide from the shield pickup trench.
Followed by Ni contact formation to gate and source regions

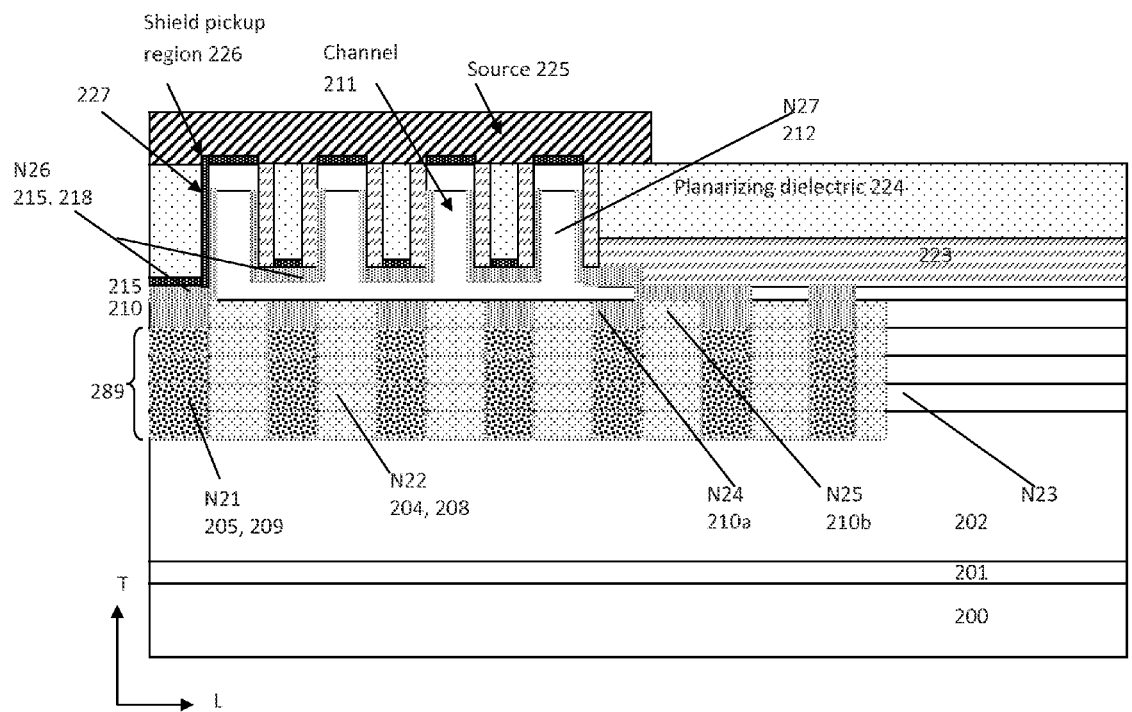
Figure 2K. Trench fill and planarization. Top overlay metal deposition and masked etch.

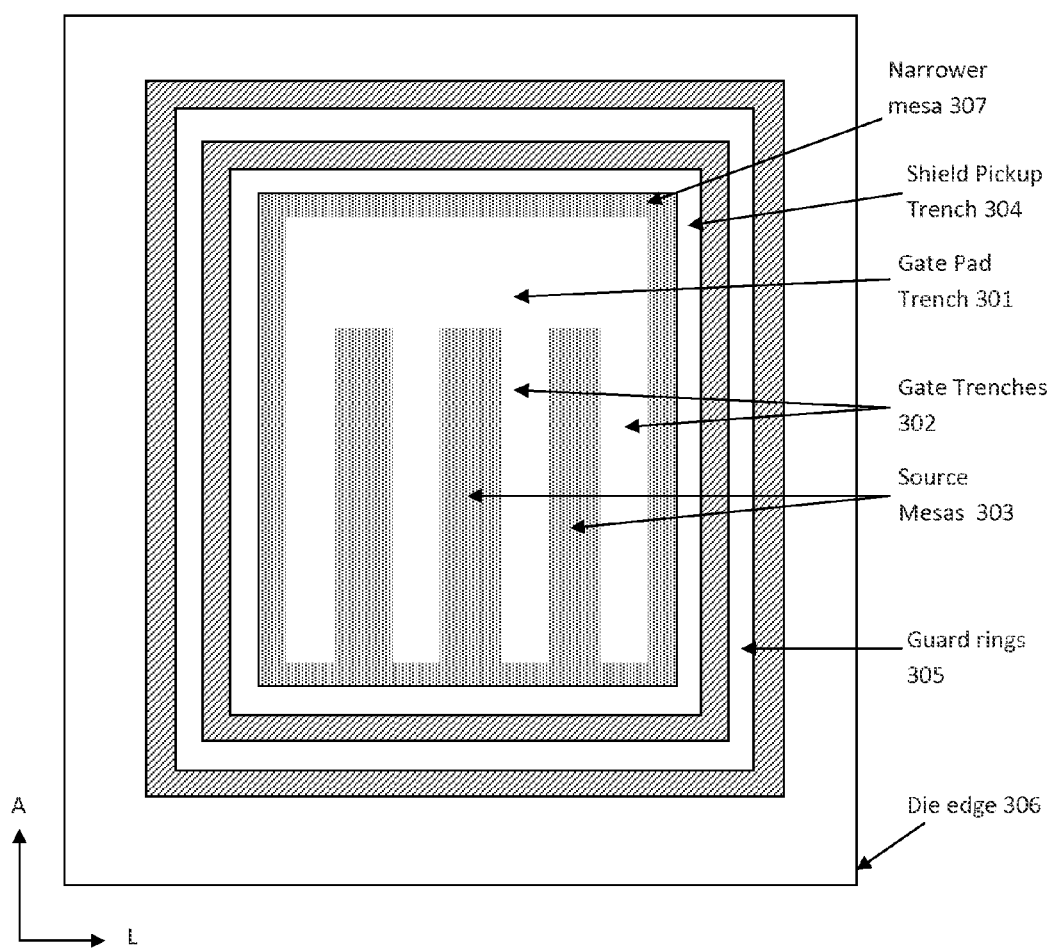
Figure 3: Layout of the shielded JFET for stripe designs

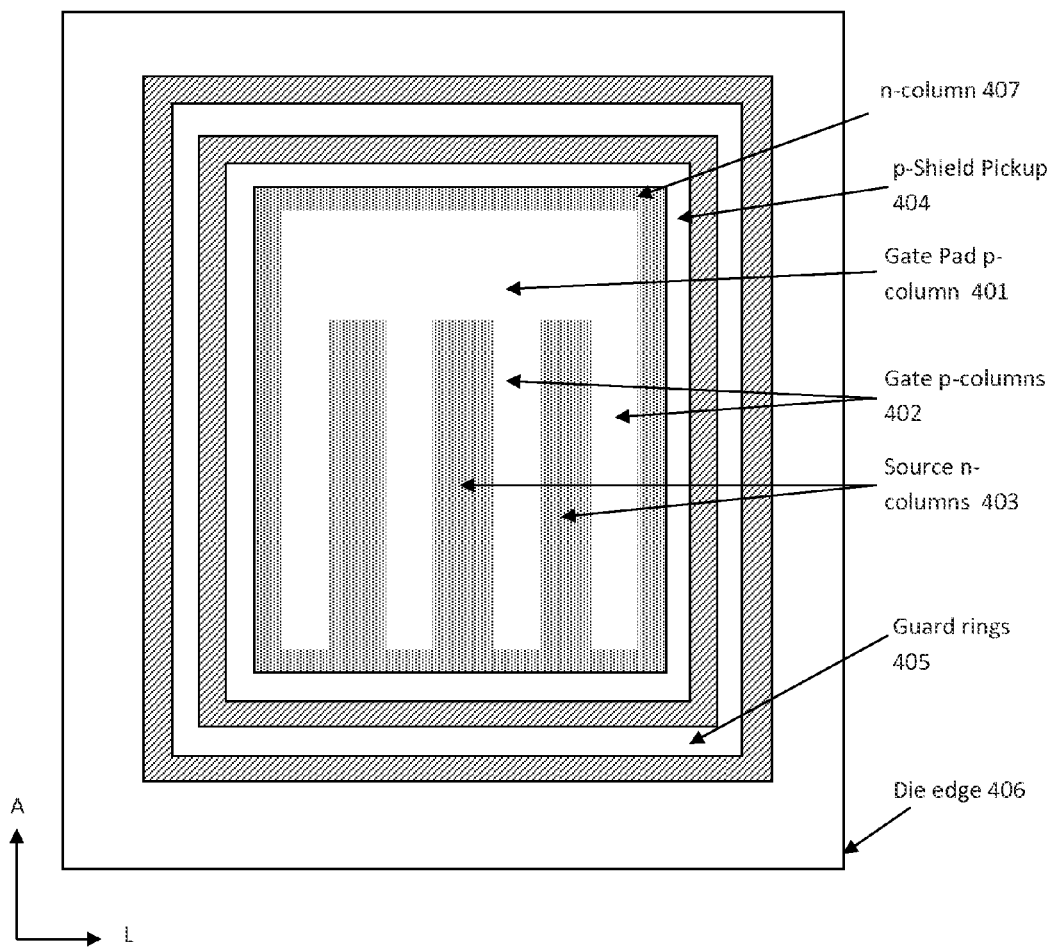
Figure 4: Schematic layout for the device of figure 1J.

VJFET DEVICES

CROSS-REFERENCE TO RELATED APPLICATIONS

This application claims priority under 35 U.S.C. §119 (e) to U.S. provisional application Ser. No. 61/792,141, filed on Mar. 15, 2013, entitled "Improved VJFET Devices," which is herein incorporated by reference in its entirety.

FIELD OF THE DISCLOSURE

The instant disclosure is in the field of high-current and high-voltage semiconductor devices. For example, high voltage normally-on and normally-off vertical junction field effect transistors (VJFETs) and methods of making the same are disclosed.

BACKGROUND

High voltage VJFETs implemented using Silicon Carbide (SiC) and other wide-bandgap materials may replace Silicon MOSFETs, superjunction MOSFETs and Silicon IGBTs in high power conversion and motor control applications. Wide bandgap semiconductors have higher breakdown fields (Ec, measured in V/cm) that translate into thinner voltage supporting drift regions, for example 10 times thinner, with higher doping, for example, greater than 10 times higher doping. This may directly result in many orders of magnitude reduction in device resistance in the on-state compared to a Silicon device of the same voltage rating.

VJFETs may be switched at relatively high frequencies with low power losses because they are unipolar devices. This may allow for more compact power electronic circuits. The switching speed is dictated by the device capacitances. In hard-switched applications, similar to most inductive loads like motors, reduced gate-drain capacitance ($C_{gd}$) may be critical.

Since the SiC VJFET devices do not have a gate oxide, they do not suffer from the reliability and yield problems faced by MOS gated Silicon Carbide devices. Furthermore, since the VJFET usually has a bulk channel instead of an inversion layer, they may be fabricated with a lower on-resistance than a MOSFET of comparable voltage rating. The absence of the gate oxide allows for reliable operation at higher peak junction temperatures.

Since SiC and other wide-bandgap materials are expensive, device structures that help decrease the die size are useful to make the devices economical for widespread use. The VJFET structures in the prior art may be improved upon both in the on-resistance per unit area at a given voltage rating, as well as in reducing $C_{gd}$ and enhancing switching speed. Structures may also be implemented to incorporate a built in PiN diode or JBS Schottky diode to accommodate circuits requiring bi-directional current flow. The disclosure is directed to these and other important needs.

SUMMARY

The superjunction charge-balance technique has been used successfully in Silicon MOSFET devices to achieve lower on-resistances than for standard MOSFETs with uniformly doped drift areas. The structure involves columns doped with nearly equal charges of n- and p-type, which result in a drift area with a near zero net doping. The p-column in a MOSFET is typically connected to the source region. When this technique is applied to a vertical JFET, if the p-column is connected to the p-gate, a lower on-resistance may be achieved but a high $C_{gd}$ may result. Therefore, it may be beneficial to connect the superjunction layer to a separate buried grid that is routed to the source electrode.

In an embodiment disclosed below, a shielded superjunction JFET may include a superjunction charge balanced area that includes implanted regions of a first conductivity type and implanted regions of a second conductivity type, a buried shield disposed above the superjunction charge balanced area along a first direction that includes regions of a first conductivity type and regions of a second conductivity type, and a link area disposed above the superjunction charge balanced area and the buried shield along the first direction. The link area may include regions of a first conductivity type and regions of a second conductivity type. The shielded superjunction JFET may also include a JFET area disposed above the superjunction charge balanced area and the buried shield along the first direction. The JFET area may include regions of a first conductivity type and regions of a second conductivity type. The shielded superjunction JFET may also include a source electrode disposed above the superjunction charge balanced region, the buried shield, and the JFET area along the first direction. The shielded superjunction JFET may also include an electrical link that may include at least one region of the second conductivity type of the link area electrically connected to and at least partially aligned with at least one region of the second conductivity type of the buried shield along the first direction and at least one region of the second conductivity type of the JFET area electrically connected to the at least one region of the second conductivity type of the link area and the source electrode, where the at least one region of the second conductivity type of the JFET area is at least partially aligned with the at least one region of the second conductivity type of the link area along the first direction and where the electrical link electrically connecting the source electrode to the buried shield so as to hold the buried shield at source electrode potential.

In another embodiment, a method of forming a shielded superjunction JFET includes forming a superjunction charge balanced area that includes implanted regions of a first conductivity type and implanted regions of a second conductivity type. The method may further include forming a buried shield disposed above the superjunction charge balanced area along a first direction that includes regions of a first conductivity type and regions of a second conductivity type. The method may further include forming a link area disposed above the superjunction charge balanced area and the buried shield along the first direction, where the link area includes regions of a first conductivity type and regions of a second conductivity type. The method may also include forming a JFET area, disposed above the superjunction charge balanced area and the buried shield along the first direction, where the JFET area includes regions of a first conductivity type and regions of a second conductivity type. The method may further include forming a source electrode disposed above the superjunction charge balanced region, the buried shield, and the JFET area along the first direction. The method may also include forming an electrical link comprising at least one region of the second conductivity type of the link area electrically connected to and at least partially aligned with at least one region of the second conductivity type of the buried shield along the first direction and at least one region of the second conductivity type of the JFET area electrically connected to the at least one region of the second conductivity type of the link area and the source electrode, where the at least one region of the second conductivity type of the JFET area is at least partially aligned with the at least one region of the second conductivity type of the link area along the first direction and where the electrical link electrically connects the source electrode to the buried shield so as to hold the buried shield at source electrode potential.

In another embodiment, a trenched and shielded superjunction JFET may include a superjunction charge balanced area that includes implanted regions of a first conductivity type and implanted regions of a second conductivity type. The trenched and shielded superjunction JFET may also include a buried shield disposed above the superjunction charge balanced area along a first direction, where the buried shield includes regions of a first conductivity type and regions of a second conductivity type. The trenched and shielded superjunction JFET may further include a channel area disposed above the superjunction charge balanced area and the buried shield along the first direction, where the channel area includes at least one channel layer of the first conductivity type with at least a first and a second trench extending partially there through along the first direction, where the first trench extends further along the first direction than the second trench, and a first region of the second conductivity type disposed in the channel layer between the first trench and the buried shield along the first direction and at least partially aligned with the first trench along the first direction. The channel area may include a second region of the second conductivity type disposed in the channel layer between the second trench and the buried shield along the first direction and at least partially aligned with the second trench along the first direction. The trenched and shielded superjunction JFET may further include a source electrode disposed above the superjunction charge balanced region, the buried shield, and the channel area along the first direction, and an electrical link that includes the first region of the second conductivity type electrically connected to and at least partially aligned with at least one region of the second conductivity type of the buried shield along the first direction and a conductive bridge at least partially disposed in the first trench, where the conductive bridge extends between the first region of the second conductivity type and the source electrode, the electrical link electrically connecting the source electrode to the buried shield so as to hold the buried shield at source electrode potential.

In an embodiment, a method of forming a trenched and shielded superjunction JFET includes forming a superjunction charge balanced area that includes implanted regions of a first conductivity type and implanted regions of a second conductivity type and forming a buried shield disposed above the superjunction charge balanced area along a first direction, where the buried shield includes regions of a first conductivity type and regions of a second conductivity type. The method of forming the trenched and shielded superjunction JFET may also include forming a channel area disposed above the superjunction charge balanced area and the buried shield along the first direction, where the channel area includes at least one channel layer of the first conductivity type with at least a first and a second trench extending partially there through along the first direction, with the first trench extending further along the first direction than the second trench, a first region of the second conductivity type disposed in the channel layer between the first trench and the buried shield along the first direction and at least partially aligned with the first trench along the first direction, and a second region of the second conductivity type disposed in the channel layer between the second trench and the buried shield along the first direction and at least partially aligned with the second trench along the first direction. The method of forming the trenched and shielded superjunction JFET may also include forming a source electrode disposed above the superjunction charge balanced region, the buried shield, and the channel area along the first direction and forming an electrical link that includes the first region of the second conductivity type electrically connected to and at least partially aligned with at least one region of the second conductivity type of the buried shield along the first direction and a conductive bridge at least partially disposed in the first trench, where the conductive bridge extends between the first region of the second conductivity type and the source electrode, the electrical link electrically connecting the source electrode to the buried shield so as to hold the buried shield at source electrode potential.

In another embodiment, a shielded JFET may include a buried shield that includes regions of a first conductivity type and regions of a second conductivity type, a link area disposed above the buried shield along a first direction, there the link area includes regions of a first conductivity type and regions of a second conductivity type, and a JFET area disposed above the buried shield along the first direction, where the JFET area includes regions of a first conductivity type and regions of a second conductivity type. The shielded JFET may also include a source electrode disposed above the buried shield and the JFET area along the first direction and an electrical link comprising at least one region of the second conductivity type of the link area electrically connected to and at least partially aligned with at least one region of the second conductivity type of the buried shield along the first direction and at least one region of the second conductivity type of the JFET area electrically connected to the at least one region of the second conductivity type of the link area and the source electrode, where the at least one region of the second conductivity type of the JFET area is at least partially aligned with the at least one region of the second conductivity type of the link area along the first direction, and where the electrical link electrically connects the source electrode to the buried shield so as to hold the buried shield at source electrode potential.

In another embodiment, a trenched and shielded JFET may include a buried shield that includes regions of a first conductivity type and regions of a second conductivity type and a channel area disposed above the buried shield along a first direction, where the channel area includes at least one channel layer of the first conductivity type with at least a first and a second trench extending partially there through along the first direction, with the first trench extending further along the first direction than the second trench, a first region of the second conductivity type disposed in the channel layer between the first trench and the buried shield along the first direction and at least partially aligned with the first trench along the first direction, and a second region of the second conductivity type disposed in the channel layer between the second trench and the buried shield along the first direction and at least partially aligned with the second trench along the first direction. The trenched and shielded JFET may further include a source electrode disposed above the buried shield and the channel area along the first direction. The trenched and shielded JFET may also include an electrical link that includes the first region of the second conductivity type electrically connected to and at least partially aligned with at least one region of the second conductivity type of the buried shield along the first direction and a conductive bridge that is at least partially disposed in the first trench and that extends between the first region of the second conductivity type and the source electrode, where the electrical link electrically connects the source electrode to the buried shield so as to hold the buried shield at source electrode potential.

BRIEF DESCRIPTION OF THE DRAWINGS

FIGS. 1A-1J illustrate an exemplary process for making a shielded superjunction vertical JFET with the buried shield layer connected to source potential, with FIG. 1J illustrating an exemplary embodiment of the final device structure.

FIGS. 2A-2K illustrate an exemplary process for making a shielded superjunction trench vertical JFET with the buried shield layer connected to source potential, with FIG. 2K illustrating an exemplary embodiment of the final device structure.

FIG. 3 illustrates an exemplary layout technique for implementing the shielded superjunction trench vertical JFET.

FIG. 4 illustrates an exemplary layout technique for implementing the shielded superjunction vertical JFET.

DETAILED DESCRIPTION OF ILLUSTRATIVE EMBODIMENTS

The present disclosure may be understood more readily by reference to the following detailed description taken in connection with the accompanying figures and examples, which form a part of this disclosure. It is to be understood that this disclosure is not limited to the specific devices, methods, applications, conditions or parameters described and/or shown herein, and that the terminology used herein is for the purpose of describing particular embodiments by way of example only and is not intended to be limiting of the claimed embodiments. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the disclosure that are, for clarity, described herein in the context of separate embodiments, may also be provided in combination in a single embodiment. Conversely, various features of the disclosure that are, for brevity, described in the context of a single embodiment, may also be provided separately or in any sub combination. Further, reference to values stated in ranges include each and every value within that range.

In an exemplary embodiment, the description may illustrate the formation of n-channel VJFETs. However it should be appreciated that the doping polarities of the n and p regions may be reversed to realize p-channel VJFETs. The doping levels chosen may depend upon, for example, the device voltage rating, the density of the superjunction and JFET regions, the pinch-off voltage design for the shield and JFET regions, and the like. An example of a 1200V JFET will be used for illustrative purposes only and should not be interpreted as limiting the scope of any claims appended hereto.

It should be understood that the various embodiments may be understood with reference to a first, second, and third direction such as, for example, lateral direction 'A', a longitudinal direction 'L' which is perpendicular to lateral direction 'A', and a transverse direction 'T' which is perpendicular to longitudinal direction 'L.' The longitudinal direction L and the lateral direction A extend horizontally as illustrated, and the transverse direction T extends vertically, though it should be appreciated that these directions may change depending, for instance, on the orientation of JFET structure. It should also be understood that first direction may be referred to as the lateral direction. It should also be understood that second direction may be referred to as the longitudinal direction. It should also be understood that third direction may be referred to as the transverse direction.

In an exemplary embodiment of the invention disclosure, the first conductivity type and the second conductivity type may refer to p-type and n-type, respectively, or n-type and p-type respectively. It should be understood that the exemplary systems described herein may contain areas which contain one or more layers of a first conductivity type and a second conductivity type. The layers, in turn, may contain regions of the first conductivity type and the second conductivity types. Individual layers may be substantially planar and extend in both the lateral direction A and the longitudinal direction L. For example, each layer may have a substantially planar upper and lower surface separated by a thickness which extends along the transverse direction T. Individual regions within a layer may have the same or similar thickness of the layer and extend along all or part of the respective layer's substantially planar upper and lower surfaces.

In an exemplary embodiment of the disclosure, the first conductivity type and the second conductivity type may refer to p-type and n-type, respectively, or n-type and p-type respectively.

FIGS. 1A-1J illustrate an exemplary embodiment of the shielded superjunction vertical JFET. FIG. 1J illustrates an exemplary final device structure with one or more buffer layers 101 built atop the N+ substrate 100. It should be understood that the buffer layer of the buffer region 101 may also be referred to as the N-buffer layer or simply a buffer layer. The one or more buffer layer(s) 101 may be 4-degree off-cut for 4H—SiC. Buffer layers(s) 101 may be followed sequentially by a charge-balanced superjunction area 189, a shield area 112, and a JFET area 178 along the transverse direction T.

The superjunction section 189 may include one or more N epitaxial layers 102 and 107. N epixatial layer 102 may be disposed on top of the one or more the buffer layers of the buffer region 101 followed sequentially by one or more of area 189 of layer 107, area 112 of layer 107, and/or area 178 of layer 107. It should be understood that N epitaxial layers of the N epitaxial region may also be referred to as the epitaxial layer or the N epi layer. The charge-balanced superjunction area 189 may include doped n-columns 108 and p-columns 109 disposed in an alternating pattern along the longitudinal direction L. N-columns 108 and n-columns 109 may be formed from individual n-regions 104 and p-regions 105, respectively, in one or more of layers 102 and 107. It should be understood that the charge-balanced superjunction area 189 may also be referred to as the superjunction charge balanced region, the charge balance superjunction layer(s), or the superjunction region. It should be understood that n-columns 108 may also be referred to as n-region 108. It should be understood that p-columns 109 may also be referred to as p-region 109.

The shield area 112 may include one or more layers where each layer may include p-shield regions 112a and n-shield regions 114 disposed in an alternating pattern along the longitudinal direction L. In an embodiment, a first group of one or more of individual p-columns 109 may be fully or partially aligned with a respective p-shield region 112a, while a second group of one or more of the n-columns 108 may be fully or partially aligned with a single n-shield region 114. It should be understood that the shield area 112 may also be referred to as a buried shield or the shield layer of the shield area 112.

The JFET area 178 may comprise p-columns 118 and 119 and n-columns 117 disposed in an alternating pattern along the longitudinal direction L. The JFET area 178 may comprise one or more layers. P-columns 118, 119 and n-columns 117 may be formed from individual n-regions and p-regions, respectively, in one or more of the layers comprising the JFET area 178. The p-shield region 112a may be connected by the p-link region 113a to a p-column 119 of the JFET area that electrically connects the p-shield area 112 to the source electrode 126 disposed above the JFET area 178 along the transverse direction T. The p-column 119 may be at source potential, and may therefore be isolated from gate p-columns 118. The p-columns 118, 119 and n-columns 117 of the JFET area 178 may also be formed by implantation of n and p type region, respectively, in the layer(s) of the JFET area 178. It should be understood that JFET area 178 may also be referred to the JFET region, the top-surface JFET area or the JFET channel regions. Additionally, it may be understood that the above n-type implants and the p-type implants in the layer(s) comprising the superjunction area 189 and shield area 112, the p-link area 113, and the JFET area 178 may be located within an active area 116 of the shielded superjunction vertical JFET. The active area 116 may be understood as an area extending along the longitudinal direction L and the lateral direction A in which the n-type implants and the p-type implants in the layer(s) that include the superjunction area 189 and shield area 112, the link area 113, and the JFET area 178 are located. The active area 116 may be surrounded by a termination area 115. It should be understood that the active area 116 may also be referred to as the active cell area 116.

FIG. 1A illustrates an exemplary starting wafer. The starting wafer may comprise a heavily doped n+ substrate 100, that may be off-cut in 4H—SiC to improve subsequent epitaxial growth, followed by an N-buffer layer of the buffer layer 101 used to reduce epi defects. It should be understood that epi may also be referred to as epitaxial. The N epi layer(s) 102 are grown, if required, with a uniform or graded n-type doping. These layers may support a small part of the device reverse blocking voltage and serve to make the final device more robust in avalanche breakdown, as well as improving the reverse recovery of the built-in shield-drain diode. The topmost portion of the epi layer 102 where the first superjunction region will be implanted, for example, may be lightly doped, similar to the next epi layer 107. It should be understood that the next epi layer 107 may also be referred to as the next epitaxial layer 107.

FIG. 1B illustrates the implantation of n-regions 104 in the superjunction area 189. After creating etched alignment marks on the wafer, a photoresist mask 103 may be applied, as illustrated in FIG. 1B, and the first n-regions 104 in the first layer of the superjunction area 189 may be implanted. For example, the first layer of n-regions 104 may be implanted in one of layers 102 or 107. In an example embodiment, the photoresist mask 103 is aligned to the etched alignment marks created and then the implantation of the n-regions 104 is performed. After the implantation, the photoresist mask 103 material is removed. Each of implanted n-regions 104 may be substantially planar, extending along the longitudinal direction L and the lateral direction A, with width extending along the longitudinal direction and a thickness extending along the third direction. Consecutive n-regions 104 may be spaced along the longitudinal direction L a distance apart from one another. It should be understood that the n-regions 104 may also be referred to as implanted n-regions.

FIG. 1C illustrates the implantation of p-regions 105 in the superjunction area 189. As illustrated in FIG. 1C, a separate photoresist mask 106 is applied aligned to the etched alignment marks and offset as illustrated from the previous mask along the longitudinal direction L, to implant the p-regions 105 into this first superjunction layer of the superjunction area 189. For example, the first layer of p-regions 105 may be implanted in one of layers 102 or 107. According to the embodiment depicted in FIG. 1C, the p-regions 105 are implanted into the first superjunction layer in the spaces between consecutive n-regions 104. The p-regions 105 may be substantially planar, extending along the longitudinal direction L and the lateral direction A, with width extending along the longitudinal direction and a thickness extending along the third direction. The photoresist mask 106 is then removed.

The next task of annealing the implant to prepare the surface for epitaxial layer growth may be accomplished using techniques such as, for example, graphitizing a photoresist film on the surface of the wafer by essentially burning out all the solvents, creating a carbon cap layer, or the like. The implants may then be activated at temperatures such as, for example, 1300 C to 2000 C, to achieve sufficient activation without excessive degradation of the SiC surface. Laser annealing, for example, may also be used to achieve similar results. The implants may be performed at a high temperature to achieve better ultimate activation. The mask illustrated in FIGS. 1B and 1C may be replaced with patterned oxides or metals that may withstand temperatures, such as, for example, in the range of 600 C to 1200 C.

The implanted charges of the n-columns 104 and p-columns 105 may be designed to be roughly balanced with each other and to achieve activated charges. The activated charges may be in the range of, for example, $3e^{12}$ cm$^{-2}$-$2e^{13}$ cm$^{-2}$. The activated charges may enable the desired on-resistance reduction with sufficient process window. The background epi layer doping for the layers of the superjunction area 189 may be doped, for example, at least 5 times or lower than the post-implant doping level of the n-columns 104, so as to not significantly affect the net charge in the n-columns 104.

FIG. 1D illustrates an exemplary method to growing a lightly doped next epitaxial layer 107. The implants in the previous exemplary methods may be placed sufficiently below the top surface. This may be performed by selecting the implant energies such as, for example, in the range of values greater than 100 KeV to several MeV, or the like, depending to the technological ability to handle thick masks with small openings. Prior to the epi growth, it may be necessary to etch a portion of the top surface to achieve good crystal quality in the lightly doped next epi layer 107. During this step, the loss of n-dopants and p-dopants from the implanted region may be minimized and the implant profiles of the n-dopants and p-dopants may be matched to lose equal amounts of each to stay charge-balanced.

FIG. 1E illustrates an exemplary method of formation of another superjunction layer of the superjunction area 189. FIG. 1E illustrates an exemplary embodiment in which subsequent p-regions 105 and n-regions 104 are implanted in the lightly doped next epitaxial layer 107 in a method similar to that illustrated above in FIGS. 1B and 1C. As further illustrated in FIG. 1E, the same n-column and p-column masks may be re-applied to form the next superjunction layer of the superjunction area 189 located above epitaxial layer 102 along the transverse direction. The n-regions 104 and the p-regions 105 in consecutive layers in the superjunction area 189 may fully or partially align with one another along the transverse direction T and start to form contiguous n-columns 108 and contiguous p-columns 109 that are charge balanced to each other. This process may be repeated several times to complete the superjunction area 189 out of multiple layers 107 containing p-regions 105 and n-regions 104 aligned in the transverse direction to form n-columns 108 and p-columns 109. For example, the n-columns 108 and p-columns 109 may be aligned to one another by aligning to the same etched alignment parts for each layer in the superjunction area 189. It should be understood that n-columns may also be referred to as n-regions. It should be understood that p-columns may also be referred to as p-regions. Since the breakdown voltage scales with the total height of the superjunction area 189, a greater number of layers may be employed for higher voltage devices and a smaller number of layers may be employed for lower voltage devices. A denser pitch of the superjunction n-columns 108 and p-columns 109 may lead to lower on-resistance, by allowing more conductive channels per unit area. This may also lead to a smaller process window for tolerating imbalance in n-column 108 and p-column 109 charges. To achieve robustness in avalanche, it may be necessary to grade the doping of the n-columns 108 and p-columns 109, with the p-columns doped somewhat higher at the top, or the n-columns doped higher near the bottom. This slight deliberate charge imbalance may shape the E-field profile so that the device breakdown increases as a function of current density in avalanche breakdown, making the device robust, and also increasing the device tolerance to charge variations due to process variations. In an exemplary embodiment, the pitch of columns 108 and 109 may refer to at least one of the distance between consecutive n-columns 108 or consecutive p-columns 109 along the longitudinal direction L.

Due to the high precision needed in the n-column 108 and p-column 109 charge, the dual implant method may be used. A method to precisely control epitaxial doping, for example, to better than 5%, may enable using the epi layer background as the n-column doping, and simply implant the p-regions. This method may further include increasing the p-implantation to a value that is high enough to counter dope the n-implant and turn the material p-type with the right net p-charge.

FIG. 1F illustrates the formation of a shield layer in the shield area 112 on top of the superjunction area 189 along the transverse direction T. As illustrated in FIG. 1F, after the superjunction area 189 is built, one or more shield layers of the shield area 112 may be formed. As illustrated in FIG. 1F, a lightly doped layer 110 may be grown on top of the superjunction region and implanted through, for example, a mask, to create the p-shield regions 112a, and again through a separate mask to create the n-shield regions 114 between the p-shield regions 112a. It should be understood that n-shield regions 114 may also be referred to as n-implant 114 and p-shield regions 112a may be referred to as p-implants 112a. Methods of mask formation, dopant activation and epitaxial re-growth or the like may be applied, and alignments may be performed to the same etched alignment marks used in the superjunction area 189. Alignments marks may be re-etched after several layers so that they are sharp enough for lithography tools to see. Thus, it is to be understood the that each p-shield regions 112a may be fully or partially aligned with a respective p-column 109 along the longitudinal direction L and each n-shield regions 114 may be fully or partially aligned with a respective n-column 108 along the longitudinal direction L. In the embodiment depicted in FIG. 1F, each p-shield region 112a is fully aligned with a respective p-column 109 and each of the n-shield regions 114 are fully aligned with a respective n-column 108. Thus, it should be understood that the p-shield regions 112a and n-shield regions 114 have the same pitch as the related columns in superjunction area 178. In another embodiment, one or more shield layers of the shield region 112 may be disposed consecutively along the transverse direction T to form the shield area 112.

The shield layer of the shield area 112 need not be charge balanced. The p-shield regions 112a may be more heavily doped than the p-regions 109 to reduce the resistance of the shield regions 112. The doping of the n-regions 114 may also be designed so as to tailor the pinch-off voltage under reverse bias to the desired value, for example, in the range of 30 V to 200V.

As further illustrated in FIG. 1F, a link area 113 may be formed on top of the shield area 112 along the transverse direction T. The link area 113 may comprise one or more link layers. For example, the link layer of the link area 113 may be formed in a subsequent lightly doped epi layer 111 disposed above the shield layer of the shield area 112. The p-column mask for this layer may block the p-implant in most of the active area 116 and allow p-implants in the select locations where the shield area 112 will be connected to the source (as described in connection with subsequent figures), depicted as a p-link region 113a. For example, as illustrated in FIG. 1F, depending on the termination design, the p-implants may also be allowed into the termination region 115. The creating of n-implant regions 113b between p-implant regions 113a in epi layer 111 may be performed using one or more openings of one or more different sizes in the active area and may use a different doping level from the n-shield regions 114 and the superjunction charge balance regions 189. For example, as depicted in FIG. 1F, while a mask blocked prevented p-link regions 113a in most of the active area 116, most of the active area is occupied by n-implant regions 113b. For instance, a single n-implant area 113b in the link area 113 may be disposed above two or more p-shield regions 112a and n-shield regions 114 of the shield area 112. As an example, in FIG. 1F, a single n-implant area 113b in the link area 113 may be disposed above nine p-shield regions 112a and n-shield regions 114 of the shield area 112.

Epi layer 111 may be heavily doped to assist with current spreading from the JFET channels in the JFET area 178 to the super junction charge balance regions 189, especially in designs where the surface JFET channels are disposed orthogonally to the sub-surface shield and superjunction area 189. Thus, as depicted in FIG. 1F, as long as the n-regions 113b are depleted, the device blocking voltage will not be reduced by a heavy doping of this layer. The charge in this layer may also ensure that "punch through" is avoided between the gate of the JFET area 178 and the shield area 112, which is source-connected.

FIG. 1G illustrates an exemplary method of how the epi growth, p-masked implant and n-masked implant and activation sequence may be used to form the JFET channels in the JFET area 178. FIG. 1G illustrates an exemplary method of the grow and implant sequence for the JFET gate and channel regions. Individual p-gate implants 118 may be comprised of p regions implanted in consecutive layers of the JFET region 178 and fully or partially aligned with another along the transverse direction T. Individual n-channel implants 117 may be comprised of n regions implanted in consecutive layers of the JFET region 178 and fully or partially aligned with another along the transverse direction T. P-gate implants 118 may be significantly heavier doped and the n-channel implants 117 may be designed for the target pinch off-voltage of the JFET. Accurate charge control through masked implants may allow for precise control of the JFET pinch-off voltages, for example, in the range of +1V to +2V for normally-off devices, and −3V to −20V for normally-on devices in SiC. Minimizing channel resistance may be facilitated by narrow p-regions 118 and n-regions 117 having a small width with heavy doping extending long the longitudinal direction L. A dense pitch may decrease the effective channel resistance, by packing more channels per unit area. In the example embodiment, the same implants that form the gate column also form a connection, p-link column 119, from the shield layers of the shield area 112 or the link layers of the link area 113 to the source electrode 126. This p-column 119 is isolated by layout from the gate p-columns and shorted to the source electrode 126. In an exemplary embodiment, the pitch of columns 117 and 118 may refer to at least one of the distance between consecutive n-columns 117 or consecutive p-columns 118 along the longitudinal direction L. For example, as depicted in FIG. 1G, the pitch of the n-regions 117 and p-regions 118 within the JFET area 178 may be shorter than the pitch of the superjunction area 189.

FIG. 1H illustrates one method for forming heavily doped surface region where gate and source contacts are to be formed. FIG. 1H illustrates an exemplary method of surface implants for contact formation. The masked n+ implant 120 is followed by masked p+ implant 121. The p+ implant to gate contact area is not illustrated in FIG. 1H, but it may be offset from the n+ contacts in the lateral direction. The gate and shield pickup uses a masked p+ implant 121, while the source regions use separately masked n+ implant 120. It should be understood that p+ implant 121 may also be referred to as p+ contact implant. It should be understood that n+ implant 120 may also be referred to as n+ contact implant. These implants may be activated together, and in practice, the layout of the n+ and p+ zones may be staggered into the plane of the paper to increase the gate-source breakdown voltage. The p+ zones may also be formed after some vertical SiC etching to create some offset between n+ source and p+ gate to get higher gate-source breakdown.

FIG. 1I illustrates an exemplary method where a dielectric is deposited and patterned. FIG. 1I illustrates an oxide deposition patterning for silicidation of p-gate, p-link and n-source regions. FIG. 1I also illustrates backside metal deposition and contact formation. The openings contact the source n+ regions everywhere in the active area, the p+ gate openings at the gate pickup areas typically at the gate pad and gate bus locations and the shield pickup p+-regions in the shield contact locations. As illustrated in FIG. 1I, the shield and source contacts 122 are seen, but the gate contacts are not, because they are usually in a separate location, that is offset along the lateral direction A which is orthogonal to the longitudinal direction L, at the active area 116 periphery. A contact metal 124 such as, Nickel (Ni) or the like may be deposited and annealed at temperatures, for example, 600 C to 750 C to form ohmic contacts. The excess material, such as, Ni or the like may be removed from the oxide regions by methods, such as, wet etching, silicide zones subjected to a temperature, for example, in the range of 900 C to 1100 C anneal to reduce contact resistance. To improve the contact resistance to the p+ regions further, for example, a two-step technique that first anneals the source contacts at a higher temperature and then the gate contacts using the same or different metal at a lower temperature may be applied. The backside ohmic contacts 123 may be formed at the same time with the same anneal, by removing the dielectric from the wafer backside by grinding or etching, depositing an Al—Ni or similar back metal prior to the anneal. It should be understood that backside ohmic contacts 123 may also be referred to as contact silicide 123.

FIG. 1J illustrates an exemplary method of depositing the front and back thick overlay metals. FIG. 1J illustrates an exemplary overlay metal frontside pattern. FIG. 1J also further illustrates the BCB or Polyimide pattern and backside overlay metal. The front and back thick overlay metals may provide a solderable backside surface and a wire bondable or solderable top surface. The top surface metal 126 is patterned to separate the gate and source 126 regions. It may be possible to isolate the shield pickup region (e.g., p-column 119), which may be brought out as a separate electrode. The top surface may be then passivated using techniques such as, BCB 128 (as illustrated in FIG. 1J) or the like to cover the termination area 115 and the regions between the gate and source. Also in FIG. 1J, a drain metal 125 (e.g., a drain electrode) is formed over the backside ohmic contacts 123.

As further illustrated in FIG. 1J, the choice of doping levels for the various regions may be informed by different design decisions. The N epi layers of the N epitaxial region 102 may be designed as a single layer or a graded or stepped profile, being lighter closer to the superjunction layers of the superjunction area 189. As an example, at least the top most region of N epi layer of the N epitaxial region 102 and layer(s) 107 may have a doping level (referred to as 'N3') that is, for example, in the range of 5 to 1000 times lighter, than the doping level of the n-regions 104 and n-columns 108 of superjunction area 189 (referred to as 'N2'). This allows the n-charge to be fully controlled by implant. The doping of the superjunction regions are chosen such that the doping of p-regions 105 and p-columns 109 of the superjunction area 189 (referred to as 'N1') are charge balanced against the doping level N2 of n-regions 104 and n-columns 108, causing both sides to deplete under reverse bias and support a hit off-state voltage. In the shield layer of the shield area 112, the p-regions 112a may having a doping level (referred to as 'N4') such that the doping level of N4 of p-regions 112a are greater than the doping level of N1. The shield region may not be designed to deplete itself, but instead, to make the n-region 114 deplete at a target voltage which may be different from the voltage at which the superjunction regions deplete. As such, the doping of the n-regions 114 (referred to as 'N5') in the shield layer of the shield area 112 will differ from doping level N2 104, 108 in the superjunction layers of the superjunction area 189. If the doping level N5 is chosen to allow it to "pinch-off" at a low enough voltage, then the doping of the n-area 113b in the link layer (referred to as 'N7') can be made heavier without loss of breakdown. The doping level N5 114 may be designed for depletion at for example, 100 V. The doping levels N4 112a and N5 114 regions have width that when combined with relative doping creates a charged balanced area 189. A higher doping level of N7 113b, for example greater than the doping level of N2 104, 108, may be selected to reduce current spreading resistance as well as prevent "punch-through" between the gate and shield p-regions. The p-doping of p-regions 113a (referred to as 'N6') of the link region 113a may be different from the doping level of N4 of the shield p-regions 112a, and may be adjusted to increase or decrease shield to source resistance. The p-doping level N6 113a of the link area 113 may be greater than the doping level of N1. The p-doping N6 of the link p-region 113a may be equal to the doping level of N4 112a of the shield layer of the shield area 112. The doping levels for the gate region 118 (referred to as 'N8') may again differ from that of the doping level N1 of superjunction p-regions 105 and columns 109, or the doping level N4 of the shield p-regions 112a. The doping levels N8 for the gate region 118 may be greater than that the doping N1 of the superjunction p-regions 105 and p-columns 109 and equal to the doping levels N6 of p-doping of p-regions 113a and the doping N4 of p-region 112a. The doping N9 of n-regions 117 that form the channel have a width extending along the longitudinal direction L and a doping level designed based on normally-on or normally-off behavior and the target "pinch-off" voltage and so will differ from the other n-region doping, for example, doping levels N2, N5 and N7, as illustrated in FIG. 1J. Individual layers that form the channel stack may have a different doping level to create graded or stepped profiles.

This method of JFET formation may or may not employ any deep trench etching, and may be largely a compilation of masked implant, epi growth and activation steps or the like, followed by methods, such as, dielectric deposition, contact formation, metal patterning and passivation, or the like. It may be applied easily to a silicon or III-V wafer processing file. Since the wafer surface stays planar and flat through most of the epi re-growth steps, dense patterns may be formed with fine line lithography to achieve excellent performance.

As illustrated in FIG. 1J, a p-region 112a of the shield area 112 may be electrically connected to the source metal 126 at location 127 through some resistance, including the resistance of a p-region 112a of the shield area 112, the p-region 113a of the link area 113, and p-column 119. It should be understood that the regions which connect the shield area 112 to the source metal 126 at location 127 may also be referred to as the location where shield shorts to source. This resistance appears in series with the drain-source capacitance of the superjunction and shield layers. As a result, it may serve to snubber the turn-off speed of the device, for example, in cases where the device is too fast during turn-off. Designers may adjust this resistance through process and layout to achieve the desired effect. An excessive resistance may cause the shield region to start tracking the drain potential and the device may then have a higher effective $C_{gd}$, which may not be desirable. This resistance may also appear in series with the drain-source P-N diode. This may be a disadvantage when the diode needs to conduct current. In many applications, it is preferred to use a separate anti-parallel JBS diode. In that instance, this resistance is actually useful in minimizing bipolar current flow in the JFET, and allowing the current to commutate fully to the JBS diode without any added circuit components.

The shield area 112, once the regions 114 are depleted, may protect the top surface of the JFET area 178 from any further E-field increase as the drain voltage rises. This makes it possible to decrease the length of the JFET channel of the JFET area 178 without losing blocking capability. A shorter channel, for example, may decrease device resistance and input capacitance further. In an example embodiment, while the superjunction regions 189 may be designed to fully deplete at values of the drain-source voltage VDS, for example, 200 V, the n-regions 114 may be designed to deplete at values of VDS, for example 100 V, and the JFET channel of the JFET region 178 to pinch-off at values of gate-source voltage VGS, for example less than 1.5 V, for a normally-off device. For example, beyond a drain bias of 100 V, the surface JFET channel E-field may not increase much with applied drain bias, allowing a dense short channel device to be formed with reduced channel resistance compared to an unshielded JFET.

The device structure and process illustrated in FIGS. 1A to 1J may be used to form a shielded JFET if the superjunction area 189 is not needed, by omitting the layers which contain the superjunction area 189 and using a lightly doped epi region to support the breakdown. This type of device may benefit from the reduced channel resistance of a short shielded JFET channel of the JFET area 178, a lower gate-drain capacitance $C_{gd}$ and a built in PN diode, but may have the drift region resistance of a conventional JFET.

For load switching applications where frequency may not be a concern, the shield and link layers may not be required, and the superjunction p-column may be directly connected to the gate p-column. The superjunction region provides shielding for the upper JFET region beyond the voltage where the superjunction p and n columns deplete. This may allow for some reduction in the channel length without a penalty in blocking performance. The device may have low on-resistance, but suffer from elevated $C_{gd}$, and may therefore be applied in this form when slower switching speeds may be tolerated, and there may be no need for a built-in PN antiparallel diode.

It may be possible to use a variety of cellular layouts for the superjunction area 189, shield area 112 and JFET regions 178, and several different layout types may be mixed to achieve target performance. FIGS. 1A to 1J illustrate a stripe type layout, where the superjunction layers of the superjunction area 189 use stripe type columns in the active area, interfacing with a stripe type shield layers of the shield area 112 with the same pitch. Above the superjunction layer of the superjunction area 189, a denser JFET area 178 is illustrated with a smaller pitch. The JFET area 178 may be laid out, for example, in an orthogonal direction (such as, for example, along lateral direction A which is orthogonal to the longitudinal direction L) to the shield and superjunction layers of the superjunction area 189 below. The shield layer may be laid out orthogonal to the superjunction layers of the superjunction area 189 when stripes are used. Alternatively, a square grid layout may be used for the for the shield layers of the shield area 112 while using a stripe or square design is used for the superjunction layers of the superjunction area 189. A closed cell square, hexagonal, circular geometry, or the like may be used to define the superjunction regions 189 and shield regions 112 and combine this with any stripe, square, hexagonal, circular cell layout, or the like for the JFET above.

FIG. 1J illustrates techniques that may be applied to the edge termination of the device. Techniques, such as, relating to superjunction device termination, such as gradually changing the charge balance between adjacent columns to allow the floating p and n regions to deplete effectively, may be applied to the edge termination of the device. A completely buried termination may also be formed using just the superjunction layers of the superjunction area 189, or the superjunction layers of the superjunction area 189 and shield layers of the shield area 112, which may help reduce electric field peaks at the die surface and improve reliability. The termination may be laid out, for example, using concentric rings of p-columns and n-columns, with a gradual variation in the charge balance to ensure proper depletion of all the floating p-columns in the termination area. The termination column widths may be designed so that when the device supports a high reverse voltage, the potential is gradually distributed across the columns between the active area 116 and the rightmost edge of the termination area 115 (as depicted in the figures) which is at drain potential, thus avoiding regions of high electric field which might otherwise reduce device breakdown voltage. Care may be taken at the edges of the active area 116 where active cells interface with the termination to avoid regions that lose charge balance and suffer from low breakdown. These techniques may involve layout that ensures local charge balance in each sub-region that breaks from the regular active cell pattern, for example, at the end of a stripe before the first p-column ring in the termination.

FIGS. 2A-2J illustrates an exemplary embodiment of the shielded superjunction vertical trench JFET. The exemplary structure illustrated in FIG. 2K results in a similar type of shielded superjunction JFET structure as in FIG. 1J, with the shield connected to source potential 226. However, in contrast to FIG. 1J, the JFET channels 211 of FIG. 2K may, for example, be formed between etched trenches 217. The gate trench 217a and shield-pickup trench 217b have different depths, each containing sidewall gate p-implants 218a and shield pickup p-implants 218b, respectively. It should be understood that the shield connected to source potential 226 may also be referred to as the shield pickup region. It should be understood that JFET channel area 211 may also be referred to as the channel region.

As illustrated in FIG. 2A, the process begins with the same starting wafer structure as in the embodiment illustrated in FIG. 1A. The N+ substrate 200 is capped first by one or more buffer layers 201, and then by epi layers 202. The top most part of N epitaxial region 202 is very lightly doped where the superjunction n-implants and p-implants will be performed. FIGS. 2B-2E follow the process illustrated in FIGS. 1B-1E to construct the superjunction area 289 with alternating charge balanced n-columns 208 and p-columns 209.

FIG. 2B illustrates the first implantation of the n-region 204 through an implant mask such as a photoresist mask 203. This method results in an implanted n-region 204. This is similar to the exemplary process illustrated and described in connection with FIG. 1B.

FIG. 2C illustrates the first implantation of the p-region 205 through an implant mask such as a photoresist mask 206. This method results in an implanted p-region 205. This is similar to the exemplary process illustrated and described in connection with FIG. 1C.

FIG. 2D illustrates the growth of the next epi layer 207. This is similar to the exemplary process illustrated and described in connection with FIG. 1D.

FIG. 2E illustrates the next pair of masked implantation of n-regions 204 and p-regions 205. This method results in an implanted p-columns 209 and implanted n-columns 208. This is similar to the exemplary process illustrated and described in connection with FIG. 1E.

FIG. 2E illustrates the formation of one or more shield layers of shield area 210 containing p-implants regions 210a and n-implants regions 210b. Forming the shield layers of shield area 210 is similar to the exemplary process of forming shield layers of shield region 112 illustrated and described in connection with FIG. 1F.

FIG. 2F further illustrates an exemplary method where subsequent to the formation of the shield layer 210 with its p-implant regions 210a and n-implant regions 210b, a thicker channel n-epi layer is grown 211 on top of the shield layers of the shield area 210 along the transverse direction T, and capped by a heavily doped n+ source contact layer 212. It should be understood that the p-implant regions 210a may also be referred to as the shield p-implant layer. It should be understood that the n-implant regions 210b may also be referred to as the shield n-implant layer. It should be understood that the channel n-epi layer 211 may also be referred to as the channel epi layer. It should be understood that the n+ source contact layer 212 may also be referred to as the n+ contact surface layer, n+ cap, n+, or the n+ contact layer. The channel epi layer 211 may have a uniform or a variably doped profile, with an elevated doping near the bottom close to the shield layers 210. The n+ surface contact layer 212 may be made of a thickness, for example, in the range of values 0.25 u to 2 u thick.

FIG. 2G illustrates an exemplary method where a mask is applied and the N+ source contact layer 212 is etched from the shield contact area 215 and from the termination area 214, leaving the n+ source contact layer 212 only in the active cell area 213. The active area 213 is where the JFET active channels are ultimately formed, while the termination area 214 may not have active JFET channels, but instead has the floating columns that gradually spread the drain potential between the active area and the die edge, preventing low breakdown voltages. The region 215 is where the contact will eventually be formed to the shield layer. The offset created between the active cell area 213 and the shield contact area 215 may enable a single trench etch step to later yield trenches of different depths to form the shield pickup and JFET gates or channels respectively, as described below.

FIG. 2H illustrates an exemplary method where a hard mask 216 is patterned on the active area 213. The hard mask 216 may consist of material, such as, for example, oxide with a Ni cap layer, or the like. Next, one or more gate trenches 217a and one or more shield pickup trenches 217b are etched, using, for example, ICP plasma tools in the case of SiC, or the like. It should be understood that gate trenches 217a and shield-pickup trenches 217b may be referred to collectively as trenches 217. The etch depth for trenches 217 may be designed to cut through the n+ cap layer 212 and reach into the channel epi layer 211 in the active cell area 213, but to stay away from the shield layer 210 below the channel epi layer 211. Due to the fact that the termination area 214 and shield contact area 215 were previously etched to a certain depth to remove the n+ cap layer 212, the effective trench depth of the shield-pickup trench(es) 217b may be greater than the depth of the gate trenches 217a by the thickness of the n+ cap layer 212. It will be understood that a mesa may be located in between consecutive trenches along the longitudinal direction L, as depicted in FIG. 2H.

FIG. 2I illustrates an exemplary method of application of a photoresist mask 219, and the implant of p-type dopant, for example, Aluminum, first vertically and then with tilted ion beams to line the trenches, creating U shaped p-regions: (1) gate p-implants 218a in trenches 217a and (2) shield pick-up p-implants 218b in trench(es) 217b that conform to the contours of the respective trenches 217. It should be understood that photoresist mask 219 may also be referred to as photoresist. The vertical and tilted ion implantation forms the gate regions 218a, shield pick-up p-implants 218b, and guard rings in the termination area 214. It should be understood that gate regions may also be referred to as gate p-implants. The shield pickup p-implants 218b are connected the p-regions 210a of the shield area 210 in the deeper trench 217b area 215. This shield pickup p-implants 218b may be isolated from the gate trenches by layout.

Alternatively, the implants into the trenches 217 may be created using two separate masks, one that does a deeper vertical implant into the termination and shield pickup regions but not in the active area gate trenches, and a separate mask to allow shallower implants that line the active area gate trenches. By these techniques, an adequate space may be maintained between the bottom of the JFET gate and the top of the p-regions 210a of the shield area 210. The "punch through" voltage of this region must exceed the gate-source maximum operating voltage desired for the device. In cases where a uniform channel layer is used, the "punch though" voltage may be enhanced by performing a masked n-type implant below the gate p-region 218a at the bottom of the trenches 217. Once all the implants are done, the hard mask 216 layer may be stripped and the implants activated using techniques, such as, for example, the graphitization and anneal technique described above.

FIG. 2J illustrates an exemplary method of oxide spacer formation. As illustrated in FIG. 2J, the masked oxide technique may preserve oxide over the termination. A second mask may be applied to strip spacer oxide from the shield pickup trenches. As illustrated in FIG. 2J, using a mask to protect the termination area, the oxide 223 is etched back anisotropically using techniques, such as, RIE, so that spacers 222 are formed in the active cell area 213. It should be understood that oxide 223 may also be referred to as termination oxide 223. It should be understood that spacers may also be referred to as sidewall spacers. The oxide 223 may be left in the termination area 214. A separate photoresist mask may be applied to protect all the oxide, but allow it to be wet etched selectively from the shield contact trench 217b. It should be understood that shield contact trench 217b may located in the shield contact area 215b. Once the resist is stripped, the contact silicidation metal may be deposited, with materials such as, for example, Al—Ni, Ni, or the like. This process will enable the contact formation to gate and source regions. An RTA treatment, for example, creates a silicide where the metal contacts the Silicon carbide surface. The excess metal may be wet etched away from the oxide surfaces, and a subsequent higher temperature anneal may be used to reduce the ohmic contact resistance to the gate and source regions, leaving the silicide in the regions for gate contact 221, source contact 220 and connecting the shield contact to the source 215. It should be understood that source contact 220 may also be referred to as the source mesa contact regions. The backside surface may be prepared for back metal deposition (e.g., the formation of the drain overlay) by grinding or etching away dielectrics left from earlier steps, back metal is deposited and annealed along with the top side second contact anneal to yield an ohmic contact to the drain as illustrated in FIG. 1J.

FIG. 2K illustrates an exemplary method of the application of a planarizing dielectric, such as BPSG (Borophosphosilicate glass) or BCB (Benzocyclobutene). FIG. 1K illustrates an exemplary trench fill and planarization and top overlay metal deposition and masked etch. The dielectric may be etched back or planarized by CMP (Chemical-mechanical polishing) to expose the tops of the source mesa contact regions 220. Then a mask is used to etch vias to connect to the gate contact region 221 in the gate pad and gate bus area. Finally, the overlay metal may be deposited front and back and patterned on the front to separate the gate and source regions, completing the device. FIG. 2K also illustrates a planarizing dielectric layer 224 and a source 225. It should be understood that the source may also be referred to as the source electrode. It should be understood that the dielectric layer 224 may also be referred to as the planarizing dielectric 224. The source 225 is connected to the shield layer 210 through the shield contact area 215.

As further illustrated in FIG. 2K, the choice of doping levels for the various regions may be informed by different design decisions. The N epi layers 202 and 207 may be designed as a single layer or a graded or stepped profile, being lighter closer to the superjunction layers of the superjunction area 289. The topmost portion of layers 202 and all of layer 207 may be very lightly doped (the doping level referred to as "N23"), for example in the range of 5 to 1000 times lighter than the doping of the superjunction n-regions 204 and n-columns 208 (referred to as "N22"). This allows the n-charge to be fully controlled by implant. The doping of the layers of the superjunction regions 289 are chosen such that the doping level of p-regions 205 and columns 209 (referred to as "N21") are charge balanced against the N22 doped n-regions 204 and columns 208, causing both sides to deplete under reverse bias and support a hit off-state voltage. In the shield layers 210, the p-regions 210a may have a doping level (referred to as "N24") such that the doping level of N24 is greater than the doping level of N21. The n-regions 210b of the shield area 210 may have a doping level (referred to as "N25"). The shield area 210 may not be designed to deplete itself, but instead, to make the n-area 210b of the shield area 210 deplete at a target voltage which may be different than the voltage at which the superjunction regions 289 deplete. As such, the doping N25 of the n-area 210b in the shield layer 210 will differ from N22 of the n-regions 204 and columns 208 in the superjunction layers of the superjunction area 289. If the doping of region N25, 210b is chosen to allow the shield region 210 to "pinch-off" at a low enough voltage, then the doping of the channel layer (referred to as "N27") can be made heavier without loss of breakdown. The doping N25 210b may be designed for depletion at value, for example, 100 V. A higher doping level of N27, for example greater than the doping level of N22, may be selected to reduce current spreading resistance as well as prevent "punch-through" between the gate and shield p-regions. The p-doping of p-implants 218a and 218b (referred to as "N26") may be different from the doping level of N24 and may be adjusted to increase or decrease shield to source resistance. The p-doping N26 may be greater than the doping level of N21. The p-doping N26 may be equal to the doping level of N24. Individual layers that form the channel stack may have a different doping level to create graded or stepped profiles.

FIG. 3 illustrates an exemplary method on how the layout may be arranged for the device described in FIGS. 2A-2K. FIG. 3 illustrates an exemplary layout of the shielded JFET for stripe designs. As illustrated in FIG. 3, the source mesas 303 (e.g., the mesas on either side of a gate trench 302) alternate with the gate trenches 302 in the active area. The gate trenches 302 terminate in a wider region, the gate pad trench 301, where the gate pad is eventually formed. Surrounding the gate trench 302 on all sides is a narrower mesa region 307 with the shield pickup trench 304. The p-guard ring structures 305 may be formed concentric with the shield pickup trench 304. It should be understood that p-guard ring structures may also be referred to as guard rings. The source metal may be extended around the gate pad 301 if necessary to connect to the shield pickup trench 304 on all four sides. FIG. 3 may also illustrate an exemplary die edge 306. In an embodiment: (1) trench 217b may be an example of a shield pickup trench 304; (2) trenches 217a may connect to a gate pad 310 and may be an example of gate trenches 302; (3) trenches 217b may define mesas which may be examples of source mesas 303; and (4) adjacent trenches 217a and 217b may form a mesa which is an example of narrow mesa 307. It should be understood that while FIGS. 2A-2K illustrate a cross sectional view of the device along the transverse direction T and the longitudinal direction L, FIG. 3 depicts a plane view of the device along the longitudinal direction L and the lateral direction A.

FIG. 4 illustrates an exemplary schematic layout of the JFET. As illustrated in FIG. 4, the source n-columns 403 alternate with the gate p-columns 402 in the active area. The gate columns terminate in a wider region, the gate pad region 401, where the gate pad is eventually formed. Surrounding the gate column on all sides is a narrower n-column region 407 with the shield pickup p-column 404. The shield pickup is separated by an n-column from p-guard ring structures 405 that are formed concentric with the shield pickup p-column. The source metal can extended around the gate pad if necessary to connect to the shield pickup column on all four sides. FIG. 4 may also illustrate an exemplary die edge 406 In an embodiment, (1) p-column 118 may be an example of gate p-columns 402; (2) n-columns 117 may be an example of n-columns 403 and may connect to a gate pad 401; (3) p-column 119 may be an example of p-shield pickup 404; and (4)

the n-column 117 located between p-column 119 and a p-column 118 may be an example of n-column 407.

In accordance with the above description and all of the attached figures, an embodiment of a shielded superjunction JFET, and an embodiment of a method of making the same, may include: a superjunction charge balanced area (189), the superjunction charge balanced area (189) including implanted regions of a first conductivity type (n-type implant columns 108) and implanted regions of a second conductivity type of (p-type implants columns 109). The JFET may also include a buried shield (112) disposed above the superjunction charge balanced area (189) along a first direction, the buried shield (112) area including regions of a first conductivity type (n-implants 112a) and regions of a second conductivity type (p-implants 112b); a link area (113), the link area (113) disposed above the superjunction charge balanced area (189) and the buried shield (112) along the first direction, the link area (113) including regions of a first conductivity type (n-channel implants 113a) and regions of a second conductivity type (p-gate implants 113b); a JFET area (178), the JFET area disposed above the superjunction charge balanced area (189) and the buried shield 112 along the first direction, the JFET area including regions of a first conductivity type (n-type columns 117) and regions of a second conductivity type (p-columns 118, and 119); a source electrode (126), the source electrode (126) disposed above the superjunction charge balanced region, the buried shield 112, and the JFET area (178) along the first direction; and an electrical link comprising, (1) at least one region of the second conductivity type (p-type 113a) of the link area (113) electrically connected to and at least partially aligned with at least one region of the second conductivity type (p-implant 112a) of the buried shield (112) along the first direction and (2) at least one region of the second conductivity type (p-gate implants 119) of the JFET area (178) electrically connected to the at least one region of the second conductivity type (p-type implant 112a) of the link area (113) and the source electrode (126), the at least one region of the second conductivity type (p-gate implants 119) of the JFET area (178) being at least partially aligned with the at least one region of the second conductivity type (p-type implant 113a) of the link area (113) along the first direction, the electrical link electrically connecting the source electrode (126) to the buried shield (112) so as to hold the buried shield (112) at source electrode (126) potential.

The embodiment of the JFET, and the method of making the same, may also include a plurality of planar layers of a first conductivity type, each of the plurality of planar layers of the first conductivity type (1) extending in a second direction perpendicular to the first direction and a third direction perpendicular to the first and the second directions, (2) having a thickness that extends in the first direction, and (3) the plurality of layers having a respective original doping concentration (N3) of the first conductivity type. The superjunction charge balanced area may include a first group of layers of the plurality of planar layers, the first group of layers comprising one or more layers, the first group of layers including a first group of implanted regions of the first conductivity type (n-implants 108) and the second conductivity type (p-implants 109) disposed adjacent to one another and in an alternating pattern along the second direction, the implanted regions of the first conductivity type (n-type) of the first group of implanted regions having a first doping concentration (N2) and the implanted regions of the second conductivity type (p-type) of the first group of implanted regions having a second doping concentration (N1), the first doping concentration and the second doping concentration resulting in a charge balance in the superjunction charge balanced area; the buried shield 112 may include a second group of layers of the plurality of planar layers, the second group of layers comprising one or more layers, the second group of layers including a second group of implanted regions of the first conductivity type (112a) and the second conductivity type (112b) disposed adjacent to one another and in an alternating pattern along the second direction, the implanted regions of the first conductivity type (112a) of the second group of implanted regions having a third doping concentration (N5) and the implanted regions of the second conductivity type (112b) of the second group of implanted regions having a fourth doping concentration (N4). The implanted regions of the second conductivity type of the first group (109) and the second group (112b) may be at least partially aligned with one another along the first direction. The link area (113) may include a third group of layers of the plurality of planar layers, the third group of layers comprising one or more layers, the third group of layers including a third group of implanted regions of the first conductivity type (113a) and the second conductivity type (113b) disposed adjacent to one another and in an alternating pattern along the second direction, the implanted regions of the first conductivity type of the third group of implanted regions (113a) having a fifth doping concentration (N7) and the implanted regions of the second conductivity type of the third group of implanted regions (113b) having a sixth doping concentration (N6). The JFET area may include a fourth group of layers of the plurality of planar layers, the fourth group of layers comprising one or more layers, the fourth group of layers including a fourth group of implanted regions of the first conductivity type (117) and a second conductivity type (118, and 119) disposed adjacent to one another and in an alternating pattern along the second direction, the implanted regions of the first conductivity type (117) of the fourth group of implanted regions having a seventh doping concentration (N9) and the implanted regions of the second conductivity type (18 and 119) of the fourth group of implanted regions having a eighth doping concentration (N8).

In the embodiment of the JFET, and the method of making the same, the first doping concentration (N2) and the seventh doping concentration (N9) are greater than the original doping concentration (N3); the first doping concentration (N2) is different than the seventh doping concentration (N9); the fourth doping concentration (N4), the sixth doping concentration (N6), and the eighth doping concentration (N8) are greater than the second doping concentration (N1); and the fourth doping concentration (N4), the sixth doping concentration (N6), and the eighth doping concentration (N8) are different from one another.

In the embodiment of the JFET, and the embodiment of making the same, the first doping concentration (N2) and the seventh doping concentration (N9) are greater than the original doping concentration (N3); the first doping concentration (N2) is equal to the seventh doping concentration (N9); the fourth doping concentration (N4), the sixth doping concentration (N6), and the eighth doping concentration (N8) are greater than the second doping concentration (N1); and the fourth doping concentration (N4), the sixth doping concentration (N6), and the eighth doping concentration (N8) are equal to one another.

In the embodiment of the JFET, the embodiment of making the same, the at least one region of the second conductivity type (119) of the electrical link (113) is separated from a second region of the second conductivity type (118) of the JFET area (178) by a first region of the first conductivity type (117 and 407) of the JFET area (178), the first region of the first conductivity type (117 and 407) surrounding the second region of the second conductivity type (118) of the JFET area (178) along the second direction and the third direction.

In the embodiment of the JFET, and the method of making the same, consecutive regions of the first conductivity type (108) in the superjunction charge balanced area are spaced along the second direction and are separated by (1) a single region of the second conductivity type (109) and (2) a first pitch; and consecutive regions of the first conductivity type (117) in the JFET area are spaced along the second direction and are separated by (1) a single region of the second conductivity type (118) and (2) a second pitch. The first pitch is different than the second pitch.

In an embodiment of the invention, and the method of making the same, consecutive regions of the first conductivity type (108) in the superjunction charge balanced area are spaced apart from one another along a fourth direction that is perpendicular to the first direction; and consecutive regions of the first conductivity type (117) in the JFET area are spaced apart from one another along a fifth direction. The fourth direction is perpendicular to the fifth direction and the first direction.

In an embodiment of the JFET, and method of making the same, the JFET area pinches off at a first voltage and the superjunction charge balanced area pinches off at a second voltage, the first voltage being smaller than the second voltage.

In accordance with the above description and all of the attached figures, an embodiment of a trenched and shielded superjunction JFET, and an embodiment of a method of making the same, may include a superjunction charge balanced area (289), the superjunction charge balanced area including implanted regions of a first conductivity type (204 and 208) and implanted regions of a second conductivity type of (205 and 209); a buried shield (210) disposed above the superjunction charge balanced area (289) along a first direction, the buried shield (210) including regions of a first conductivity type (210b) and regions of a second conductivity type (210a); a channel area (211), the channel area disposed above the superjunction charge balanced area (289) and the buried shield 210 along the first direction, the channel area comprising (1) at least one channel layer of the first conductivity type with at least a first (217b) and a second trench (217a) extending partially there through along the first direction, the first trench extending further along the first direction than the second trench, (2) a first region (218b) of the second conductivity type disposed in the channel layer between the first trench and the buried shield (210) along the first direction and at least partially aligned with the first trench along the first direction; and (3) a second region (218a) of the second conductivity type disposed in the channel layer between the second trench and (2) the buried shield (210) along the first direction and at least partially aligned with the second trench along the first direction; a source electrode 225, the source electrode 225 disposed above the superjunction charge balanced region, the buried shield, and the channel area 211 along the first direction; and an electrical link (215) comprising, (1) the first region of the second conductivity type (218b) electrically connected to and at least partially aligned with at least one region of the second conductivity type (210a) of the buried shield (210) along the first direction and (2) a conductive bridge 227 at least partially disposed in the first trench, the conductive bridge extending between the first region of the second conductivity type (218b) and the source electrode (225), the electrical link electrically connecting the source electrode (225) to the buried shield (210) so as to hold the buried shield (210) at source electrode (225) potential.

In the embodiment of the trenched and shielded superjunction JFET, and the method of making the same, a plurality of planar layers of a first conductivity type, each of the plurality of planar layers of the first conductivity type (1) extending in a second direction perpendicular to the first direction and a third direction perpendicular to the first and the second directions, (2) having a thickness that extends in the first direction, and (3) the plurality of layers having a respective original doping concentration (N23) of the first conductivity type. The superjunction charge balanced area (289) comprises a first group of layers of the plurality of planar layers, the first group of layers comprising one or more layers, the first group of layers including a first group of implanted regions of the first conductivity type (204 and 208) and the second conductivity type (205 and 209) disposed adjacent to one another and in an alternating pattern along the second direction, the implanted regions of the first conductivity type (204 and 208) of the first group of implanted regions having a first doping concentration (N22) and the implanted regions of the second conductivity type (20 and 209) of the first group of implanted regions having a second doping concentration (N21), the first doping concentration and the second doping concentration resulting in a charge balance in the superjunction charge balanced region. The buried shield 210 comprises a second group of layers of the plurality of planar layers, the second group of layers comprising one or more layers, the second group of layers including a second group of implanted regions of the first conductivity type (210b) and the second conductivity type (210a) disposed adjacent to one another and in an alternating pattern along the second direction, the implanted regions of the first conductivity type of the second group of implanted regions (210b) having a third doping concentration (N25) and the implanted regions of the second conductivity type (210a) of the second group of implanted regions having a fourth doping concentration (N24); wherein the implanted regions of the second conductivity type of the first group and the second group are aligned along the first direction. The channel area comprises a third group of layers, the third group of layers comprising the at least one channel layer of the first conductivity type (217b) having a fifth doping concentration (N27), the implanted first and second regions of the second conductivity type (217a) of the third group of implanted regions having a sixth doping concentration (N26).

In the embodiment of the trenched and shielded superjunction JFET, and the method of making the same, the first doping concentration (N22) and the sixth doping concentration (N26) are greater than the original doping concentration (N23), the first doping concentration (N22) is different than the sixth doping concentration (N26); the fourth doping concentration (N24) and the sixth doping concentration (N26), and are greater than the second doping concentration (N21); and the fourth doping concentration (N24) and the sixth doping concentration (N26) are different from one another.

In the embodiment of the trenched and shielded superjunction JFET, and the method of making the same, the first doping concentration (N22) and the sixth doping concentration (N26) are greater than the original doping concentration (N23), the first doping concentration (N22) is different than the sixth doping concentration (N26); the fourth doping concentration (N24) and the sixth doping concentration (N26), and are greater than the second doping concentration (N21); and the fourth doping concentration (N24) and the sixth doping concentration (N26) are equal to one another.

In the embodiment of the trenched and shielded superjunction JFET, and the method of making the same, the superjunction trench JFET further comprises: a mesa separating the first region (218b) of the second conductivity type of the channel area (211) from the second region (218a) of the second conductivity type of the channel area (211), the mesa surrounding the second region (218a) of the second conductivity type of the channel area (211) along the second direction and the third direction.

In the embodiment of the trenched and shielded superjunction JFET, and the method of making the same, consecutive regions of the first conductivity type (204 and 209) in the superjunction charge balanced area along the second direction and are separated by (1) a single region of the second conductivity type (205 and 209) and (2) a first pitch; and the second trench and a third trench of the channel area along the second direction are separated by (1) a single mesa and (2) a second pitch, the first pitch is different than the second pitch.

In the embodiment of the trenched and shielded superjunction JFET, and the method of making the same, consecutive regions of the first conductivity type (204 and 209) in the superjunction charge balanced area are spaced from one another along a fourth direction; and first and the second trenches (217b and 217a) of the channel area are spaced apart from one another along a fifth direction; and the fourth direction is perpendicular to the fifth direction and the fourth direction.

In the embodiment of the trenched and shielded superjunction JFET, and the method of making the same, the channel area pinches off at a first voltage and the superjunction charge balanced area pinches off at a second voltage, the first voltage being smaller than the second voltage.

In accordance with the above description and all of the attached figures, an embodiment of a shielded JFET, and an embodiment of a method of making the same, may include a buried shield (112), the buried shield (112) area including regions of a first conductivity type (n-implants 112a) and regions of a second conductivity type (p-implants 112b); a link area (113), the link area (113) disposed above the buried shield (112) along a first direction, the link area (113) including regions of a first conductivity type (n-channel implants 113a) and regions of a second conductivity type (p-gate implants 113b); a JFET area (178), the JFET area disposed above the buried shield 112 along the first direction, the JFET area including regions of a first conductivity type (n-type columns 117) and regions of a second conductivity type (p-columns 118, and 119); a source electrode (126), the source electrode (126) disposed the buried shield 112, and the JFET area (178) along the first direction; and an electrical link comprising, (1) at least one region of the second conductivity type (p-type 113a) of the link area (113) electrically connected to and at least partially aligned with at least one region of the second conductivity type (p-implant 112a) of the buried shield (112) along the first direction and (2) at least one region of the second conductivity type (p-gate implants 119) of the JFET area (178) electrically connected to the at least one region of the second conductivity type (p-type implant 112a) of the link area (113) and the source electrode (126), the at least one region of the second conductivity type (p-gate implants 119) of the JFET area (178) being at least partially aligned with the at least one region of the second conductivity type (p-type implant 113a) of the link area (113) along the first direction, the electrical link electrically connecting the source electrode (126) to the buried shield (112) so as to hold the buried shield (112) at source electrode (126) potential.

The embodiment of the shielded JFET, and method of making the same, may include a plurality of planar layers of a first conductivity type, each of the plurality of planar layers of the first conductivity type (1) extending in a second direction perpendicular to the first direction and a third direction perpendicular to the first and the second directions, (2) having a thickness that extends in the first direction, and (3) the plurality of layers having a respective original doping concentration (N3) of the first conductivity type; the buried shield 112 comprises a second group of layers of the plurality of planar layers, the second group of layers comprising one or more layers, the second group of layers including a second group of implanted regions of the first conductivity type (112a) and the second conductivity type (112b) disposed adjacent to one another and in an alternating pattern along the second direction, the implanted regions of the first conductivity type (112a) of the second group of implanted regions having a third doping concentration (N5) and the implanted regions of the second conductivity type (112b) of the second group of implanted regions having a fourth doping concentration (N4); the implanted regions of the second conductivity type of the first group (109) and the second group (112b) are at least partially aligned with one another along the first direction; the link area (113) comprises a third group of layers of the plurality of planar layers, the third group of layers comprising one or more layers, the third group of layers including a third group of implanted regions of the first conductivity type (113a) and the second conductivity type (113b) disposed adjacent to one another and in an alternating pattern along the second direction, the implanted regions of the first conductivity type of the third group of implanted regions (113a) having a fifth doping concentration (N7) and the implanted regions of the second conductivity type of the third group of implanted regions (113b) having a sixth doping concentration (N6); and the JFET area comprises a fourth group of layers of the plurality of planar layers, the fourth group of layers comprising one or more layers, the fourth group of layers including a fourth group of implanted regions of the first conductivity type (117) and a second conductivity type (118, and 119) disposed adjacent to one another and in an alternating pattern along the second direction, the implanted regions of the first conductivity type (117) of the fourth group of implanted regions having a seventh doping concentration (N9) and the implanted regions of the second conductivity type (18 and 119) of the fourth group of implanted regions having a eighth doping concentration (N8).

In accordance with the above description and all of the attached figures, an embodiment of a trenched and shielded JFET, and an embodiment of a method of making the same, may include a buried shield (210) the buried shield (210) including regions of a first conductivity type (210b) and regions of a second conductivity type (210a); a channel area (211), the channel area disposed above the buried shield 210 along a first direction, the channel area comprising (1) at least one channel layer of the first conductivity type with at least a first (217b) and a second trench (217a) extending partially there through along the first direction, the first trench extending further along the first direction than the second trench, (2) a first region (218b) of the second conductivity type disposed in the channel layer between the first trench and the buried shield (210) along the first direction and at least partially aligned with the first trench along the first direction; and (3) a second region (218a) of the second conductivity type disposed in the channel layer between the second trench and (2) the buried shield (210) along the first direction and at least partially aligned with the second trench along the first direction; a source electrode 225, the source electrode 225 disposed above the buried shield, and the channel area 211 along the first direction; and an electrical link (215) comprising, (1) the first region of the second conductivity type (218b) electrically connected to and at least partially aligned with at least one region of the second conductivity type (210a) of the buried shield (210) along the first direction and (2) a conductive bridge 227 at least partially disposed in the first trench, the conductive bridge extending between the first region of the second conductivity type (218b) and the source electrode (225), the electrical link electrically connecting the source electrode (225) to the buried shield (210) so as to hold the buried shield (210) at source electrode (225) potential.

The embodiment of the trenched and shielded JFET, and method of making the same, further includes a plurality of planar layers of a first conductivity type, each of the plurality of planar layers of the first conductivity type (1) extending in a second direction perpendicular to the first direction and a third direction perpendicular to the first and the second directions, (2) having a thickness that extends in the first direction, and (3) the plurality of layers having a respective original doping concentration (N23) of the first conductivity type; wherein the buried shield 210 comprises a second group of layers of the plurality of planar layers, the second group of layers comprising one or more layers, the second group of layers including a second group of implanted regions of the first conductivity type (210b) and the second conductivity type (210a) disposed adjacent to one another and in an alternating pattern along the second direction, the implanted regions of the first conductivity type of the second group of implanted regions (210b) having a third doping concentration (N25) and the implanted regions of the second conductivity type (210a) of the second group of implanted regions having a fourth doping concentration (N24); wherein the implanted regions of the second conductivity type of the first group and the second group are aligned along the first direction; and wherein the channel area comprises a third group of layers, the third group of layers comprising the at least one channel layer of the first conductivity type (217b) having a fifth doping concentration (N27), the implanted first and second regions of the second conductivity type (217a) of the third group of implanted regions having a sixth doping concentration (N26).

What is claimed is:

1. A shielded superjunction junction gate field-effect transistor (JFET) comprising:
    a superjunction charge balanced area comprising a first implanted region of n-type conductivity and a second implanted region of p-type conductivity;
    a buried shield area disposed above the superjunction charge balanced area at a first direction comprising a first plurality of regions of n-type conductivity and a second plurality of regions of p-type conductivity;
    a link area disposed above the superjunction charge balanced area and the buried shield area at the first direction comprising a third plurality of regions of n-type conductivity and a fourth plurality of regions of p-type conductivity;
    a JFET area disposed above the superjunction charge balanced area and the buried shield area at the first direction comprising a fifth plurality of regions of n-type conductivity and a sixth plurality of regions of p-type conductivity;
    a source electrode disposed above the superjunction charge balanced area, the buried shield area, and the JFET area at the first direction; and
    an electrical link comprising:
        a first region of p-type conductivity of the link area electrically connected to, and at least partially aligned with, a first region of p-type conductivity of the buried shield area at the first direction, and
        a second region of p-type conductivity of the JFET area electrically connected to the first region of p-type conductivity of the link area and the source electrode,
        wherein the second region of p-type conductivity of the JFET area is at least partially aligned with the first region of p-type conductivity of the link area at the first direction, and
        wherein the electrical link electrically connects the source electrode to the buried shield area holding the buried shield area at source electrode potential.

2. The shielded superjunction JFET of claim 1, further comprising:
    a plurality of planar layers of n-type conductivity, wherein each of the plurality of planar layers extends in a second direction perpendicular to the first direction and in a third direction perpendicular to the first direction and the second direction, wherein each of the plurality of planar layers has a thickness that extends in the first direction, and wherein each of the plurality of planar layers has a respective original doping concentration of n-type conductivity;
    wherein the superjunction charge balanced area comprises a first group of layers of the plurality of planar layers, the first group of layers comprising at least one layer, the first group of layers comprising a first group of implanted regions of n-type conductivity and a second group of implanted regions of p-type conductivity, wherein ones of the first group of implanted regions are disposed adjacent to ones of the second group of implanted regions in an alternating pattern at the second direction, wherein the first group of implanted regions have a first doping concentration, wherein the second group of implanted regions have a second doping concentration, and wherein the first doping concentration and the second doping concentration result in a charge balance in the superjunction charge balanced area;
    wherein the buried shield area comprises a second group of layers of the plurality of planar layers, the second group of layers comprising at least one layer, the second group of layers comprising a third group of implanted regions of n-type conductivity and a fourth group of implanted regions of p-type conductivity, wherein ones of the third group of implanted regions are disposed adjacent to ones of the fourth group of implanted regions in an alternating pattern at the second direction, wherein the third group of implanted regions have a third doping concentration, and wherein the fourth group of implanted regions have a fourth doping concentration;
    wherein the second group of implanted regions and the fourth group of implanted regions are at least partially aligned with each other at the first direction;
    wherein the link area comprises a third group of layers of the plurality of planar layers, the third group of layers comprising one or more layers, the third group of layers comprises a fifth group of implanted regions of n-type conductivity and a sixth group of implanted regions of p-type conductivity, wherein ones of the fifth group of implanted regions are disposed adjacent to ones of the sixth group of implanted regions in an alternating pattern at the second direction, wherein the fifth group of implanted regions have a fifth doping concentration, and wherein the sixth group of implanted regions have a sixth doping concentration; and
    wherein the JFET area comprises a fourth group of layers of the plurality of planar layers, the fourth group of layers comprising one or more layers, the fourth group of layers comprising a seventh group of implanted regions of n-type conductivity and an eighth group of implanted regions of p-type conductivity, wherein ones of the seventh group of implanted regions are disposed adjacent to ones of the eighth group of implanted regions in an alternating pattern at the second direction, wherein the seventh group of implanted regions have a seventh doping concentration, and wherein the eighth group of implanted regions have an eighth doping concentration.

3. The shielded superjunction JFET of claim 2, wherein the first doping concentration and the seventh doping concentration are greater than the original doping concentration;
wherein the first doping concentration is different than the seventh doping concentration;
wherein the fourth doping concentration, the sixth doping concentration, and the eighth doping concentration are greater than the second doping concentration; and
wherein the fourth doping concentration, the sixth doping concentration, and the eighth doping concentration are different from one another.

4. The shielded superjunction JFET of claim 2, wherein the first doping concentration and the seventh doping concentration are greater than the original doping concentration;
wherein the first doping concentration is equal to the seventh doping concentration;
wherein the fourth doping concentration, the sixth doping concentration, and the eighth doping concentration are greater than the second doping concentration; and
wherein the fourth doping concentration, the sixth doping concentration, and the eighth doping concentration are equal to one another.

5. The shielded superjunction JFET of claim 1, wherein the first region of p-type conductivity of the link area is separated from the second region of p-type conductivity of the JFET area by a first region of n-type conductivity of the JFET area that surrounds the second region of p-type conductivity of the JFET area at the second direction and the third direction.

6. The shielded superjunction JFET of claim 1, wherein consecutive regions of n-type conductivity in the superjunction charge balanced area are spaced at the second direction and separated by a single region of p-type conductivity and a first pitch; and
wherein consecutive regions of n-type conductivity in the JFET area are spaced at the second direction and separated by a single region of p-type conductivity and a second pitch, wherein the first pitch is different than the second pitch.

7. The shielded superjunction JFET of claims 1, wherein consecutive regions of n-type conductivity in the superjunction charge balanced area are spaced apart from one another at a fourth direction that is perpendicular to the first direction;
wherein consecutive regions of n-type conductivity in the JFET area are spaced apart from one another at a fifth direction; and
wherein the fourth direction is perpendicular to the fifth direction and the first direction.

8. The shielded superjunction JFET of claim 1, wherein the JFET area pinches off at a first voltage and the superjunction charge balanced area pinches off at a second voltage, wherein the first voltage is less than the second voltage.

9. The shielded superjunction JFET of claim 8, wherein the first voltage is within one of the ranges of +1V to +2V or −3V to −20V.

10. The shielded superjunction JFET of claim 1, wherein the electric link has a resistance that reduces the turn-off speed of the shielded superjunction JFET.

11. A method of forming a shielded superjunction junction gate field-effect transistor (JFET) comprising:
forming a superjunction charge balanced area comprising a first implanted region of n-type conductivity and a second implanted region of p-type conductivity;
forming a buried shield area disposed above the superjunction charge balanced area at a first direction comprising a first plurality of regions of n-type conductivity and a second plurality of regions of p-type conductivity;
forming a link area disposed above the superjunction charge balanced area and the buried shield area at the first direction comprising a third plurality of regions of n-type conductivity and a fourth plurality of regions of p-type conductivity;
forming a JFET area disposed above the superjunction charge balanced area and the buried shield area at the first direction comprising a fifth plurality of regions of n-type conductivity and a sixth plurality of regions of p-type conductivity;
forming a source electrode disposed above the superjunction charge balanced area, the buried shield area, and the JFET area at the first direction; and
forming an electrical link comprising:
a first region of p-type conductivity of the link area electrically connected to, and at least partially aligned with, a first region of p-type conductivity of the buried shield area at the first direction, and
a second region of p-type conductivity of the JFET area electrically connected to the first region of p-type conductivity of the link area and the source electrode, wherein the second region of p-type conductivity of the JFET area is at least partially aligned with the first region of p-type conductivity of the link area at the first direction, and
wherein the electrical link electrically connects the source electrode to the buried shield area so as to hold the buried shield area at source electrode potential.

12. The method of claim 11 further comprising:
forming a plurality of planar layers of n-type conductivity, wherein each of the plurality of planar layers extends in a second direction perpendicular to the first direction and in a third direction perpendicular to the first direction and the second direction, wherein each of the plurality of planar layers has a thickness that extends in the first direction, and wherein each of the plurality of planar layers has a respective original doping concentration of n-type conductivity;
wherein the superjunction charge balanced area is formed to comprise a first group of layers of the plurality of planar layers, the first group of layers comprising at least one layer, the first group of layers comprising a first group of implanted regions of n-type conductivity and a second group of implanted regions of p-type conductivity, wherein ones of the first group of implanted regions are disposed adjacent to ones of the second group of implanted regions in an alternating pattern at the second direction, wherein the first group of implanted regions have a first doping concentration, wherein the second group of implanted regions have a second doping concentration, and wherein the first doping concentration and the second doping concentration result in a charge balance in the superjunction charge balanced area;
wherein the buried shield area is formed to comprise a second group of layers of the plurality of planar layers, the second group of layers comprising at least one layer, the second group of layers comprising a third group of implanted regions of n-type conductivity and a fourth group of implanted regions of p-type conductivity, wherein ones of the third group of implanted regions are disposed adjacent to ones of the fourth group of implanted regions in an alternating pattern at the second direction, wherein the third group of implanted regions have a third doping concentration, and wherein the fourth group of implanted regions have a fourth doping concentration;

wherein the second group of implanted regions and the fourth group of implanted regions are at least partially aligned with each other at the first direction;

wherein the link area is formed to comprise a third group of layers of the plurality of planar layers, the third group of layers comprising one or more layers, the third group of layers comprises a fifth group of implanted regions of n-type conductivity and a sixth group of implanted regions of p-type conductivity, wherein ones of the fifth group of implanted regions are disposed adjacent to ones of the sixth group of implanted regions in an alternating pattern at the second direction, wherein the fifth group of implanted regions have a fifth doping concentration, and wherein the sixth group of implanted regions have a sixth doping concentration; and wherein the JFET area is formed to comprise a fourth group of layers of the plurality of planar layers, the fourth group of layers comprising one or more layers, the fourth group of layers comprising a seventh group of implanted regions of n-type conductivity and an eighth group of implanted regions of p-type conductivity, wherein ones of the seventh group of implanted regions are disposed adjacent to ones of the eighth group of implanted regions in an alternating pattern at the second direction, wherein the seventh group of implanted regions have a seventh doping concentration, and wherein the eighth group of implanted regions have an eighth doping concentration.

13. The method of claim 12, wherein the first doping concentration and the seventh doping concentration are greater than the original doping concentration;
wherein the first doping concentration is different than the seventh doping concentration;
wherein the fourth doping concentration, the sixth doping concentration, and the eighth doping concentration are greater than the second doping concentration; and
wherein the fourth doping concentration, the sixth doping concentration, and the eighth doping concentration are different from one another.

14. The method of claim 12, wherein the first doping concentration and the seventh doping concentration are greater than the original doping concentration;
wherein the first doping concentration is equal to the seventh doping concentration;
wherein the fourth doping concentration, the sixth doping concentration, and the eighth doping concentration are greater than the second doping concentration; and
wherein the fourth doping concentration, the sixth doping concentration, and the eighth doping concentration are equal to one another.

15. The method of claim 11, wherein the first region of p-type conductivity of the link area is formed to be separated from the second region of p-type conductivity of the JFET area by a first region of n-type conductivity of the JFET area that surrounds the second region of p-type conductivity of the JFET area at the second direction and the third direction.

16. The method of claim 11, wherein consecutive regions of n-type conductivity in the superjunction charge balanced area are formed to be spaced at the second direction and separated by a single region of p-type conductivity and a first pitch; and
wherein consecutive regions of n-type conductivity in the JFET area are formed to be spaced at the second direction and separated by a single region of p-type conductivity and a second pitch, wherein the first pitch is different than the second pitch.

17. The method of claim 11, wherein consecutive regions of n-type conductivity in the superjunction charge balanced area are formed to be spaced apart from one another at a fourth direction that is perpendicular to the first direction;
wherein consecutive regions of n-type conductivity in the JFET area are formed to be spaced apart from one another at a fifth direction; and
wherein the fourth direction is perpendicular to the fifth direction and the first direction.

18. The method of claim 11, wherein the JFET area is formed to pinch off at a first voltage and the superjunction charge balanced area is formed to pinch off at a second voltage, wherein the first voltage is less than the second voltage.

19. The method of claim 18, wherein the first voltage is within one of the ranges of +1V to +2V or −3V to −20V.

20. The method of claim 11, wherein the electric link is formed with a resistance that reduces the turn-off speed of the shielded superjunction JFET.

* * * * *